(12) United States Patent
Huang

(10) Patent No.: US 12,707,961 B2
(45) Date of Patent: Aug. 11, 2026

(54) METHOD OF FORMING A CAP LAYER FOR SEALING AN AIR GAP, AND SEMICONDUCTOR DEVICE

(71) Applicant: TAIWAN SEMICONDUCTOR MANUFACTURING COMPANY, LTD., Hsinchu (TW)

(72) Inventor: Yu-Lien Huang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 994 days.

(21) Appl. No.: 17/577,833

(22) Filed: Jan. 18, 2022

(65) Prior Publication Data

US 2023/0230876 A1 Jul. 20, 2023

(51) Int. Cl.

| | |
|---|---|
| ***H01L 21/768*** | (2006.01) |
| ***H01L 23/522*** | (2006.01) |
| ***H10W 20/00*** | (2026.01) |
| ***H10W 20/42*** | (2026.01) |
| ***H10W 20/46*** | (2026.01) |

(52) U.S. Cl.

CPC ......... *H10W 20/46* (2026.01); *H10W 20/056* (2026.01); *H10W 20/062* (2026.01); *H10W 20/072* (2026.01); *H10W 20/077* (2026.01); *H10W 20/42* (2026.01)

(58) Field of Classification Search

CPC ........... H01L 21/7682; H01L 21/76834; H01L 21/7684; H01L 21/76877; H01L 23/5226; H01L 29/4991; H01L 29/6653; H01L 29/6656; H01L 29/66553; H10D 62/021; H10D 64/015; H10D 64/017; H10D 64/021; H10D 64/679; H10W 20/0696; H10W 20/069; H10W 20/077; H10W 20/42; H10W 20/422; H10W 20/46

See application file for complete search history.

(56) References Cited

U.S. PATENT DOCUMENTS

| | | | | |
|---|---|---|---|---|
| 2020/0091345 | A1* | 3/2020 | Chiu | H01L 29/7851 |
| 2020/0127109 | A1* | 4/2020 | Wang | H01L 21/7682 |
| 2021/0098598 | A1* | 4/2021 | Yang | H01L 21/31144 |

* cited by examiner

*Primary Examiner* — Raj R Gupta

(74) *Attorney, Agent, or Firm* — Birch, Stewart, Kolasch & Birch, LLP

(57) ABSTRACT

A method of forming a cap layer for sealing an air gap is provided. The method includes forming a line feature over a substrate, forming a contact etch stop layer (CESL) on a sidewall of the line feature, forming a sacrificial layer on a sidewall of the CESL, forming a liner layer on a sidewall of the sacrificial layer, removing the sacrificial layer to form an air gap which is bordered at the CESL and the liner layer and which is adjacent to the line feature, etching back upper ends of the CESL and the liner layer to widen an opening of the air gap, and forming a cap layer to seal the opening of the air gap thus widened.

20 Claims, 20 Drawing Sheets

FIG. 11

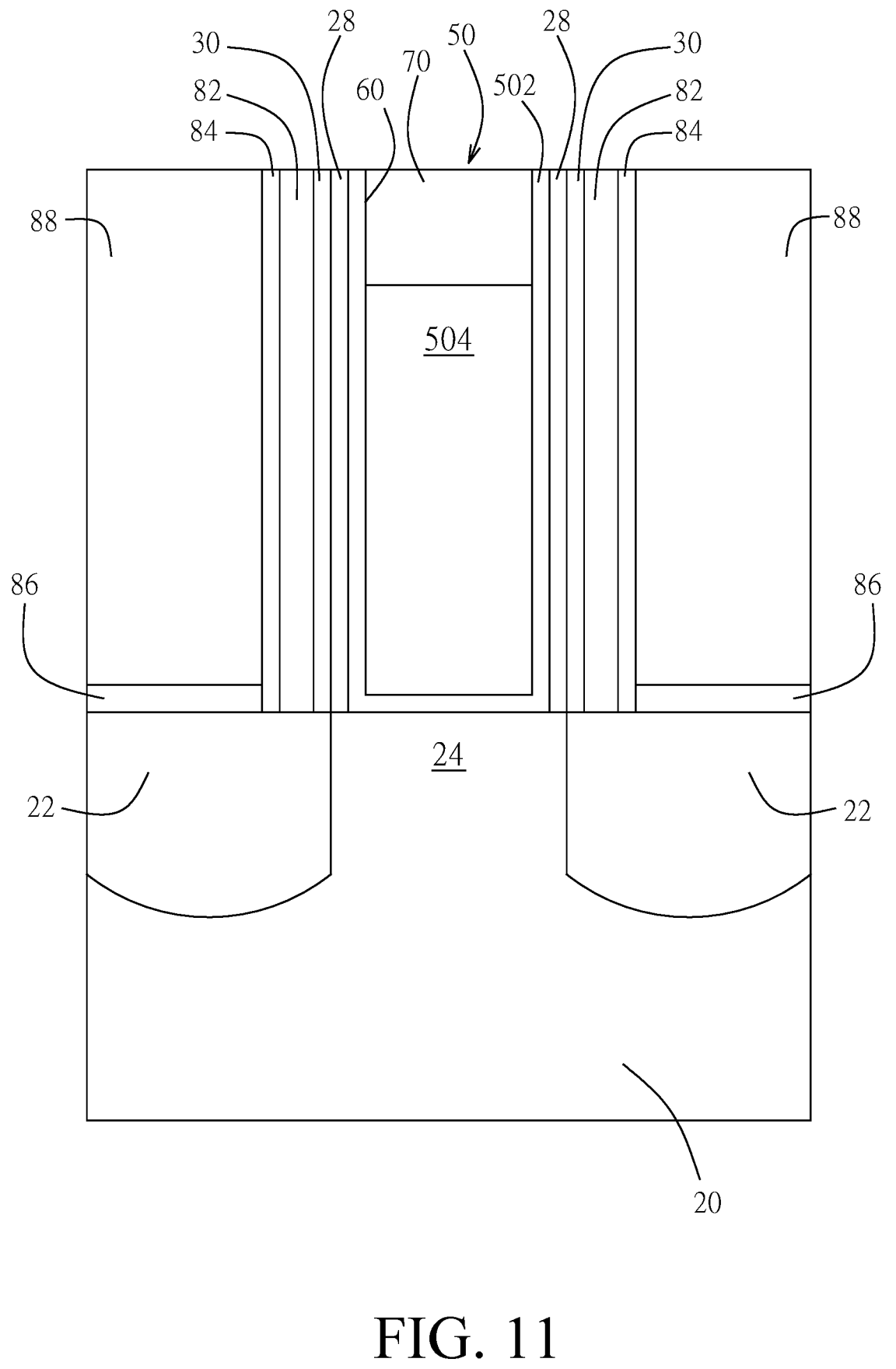

METHOD OF FORMING A CAP LAYER FOR SEALING AN AIR GAP, AND SEMICONDUCTOR DEVICE

BACKGROUND

Air gap structures have been employed in different semiconductor devices to reduce undesirable device capacitance therein because air has a relatively low dielectric constant of approximately 1.0. However, when an etching process is performed near an air gap structure, the air gap structure which defines an air gap may be damaged and hence expose a conductor adjacent to the air gap structure, which would cause leakage between the conductor and another conductor.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2 to 18 are schematic cross-sectional views illustrating intermediate stages of the method as depicted in FIG. 1, in accordance with some embodiments.

DETAILED DESCRIPTION

Figure 1:
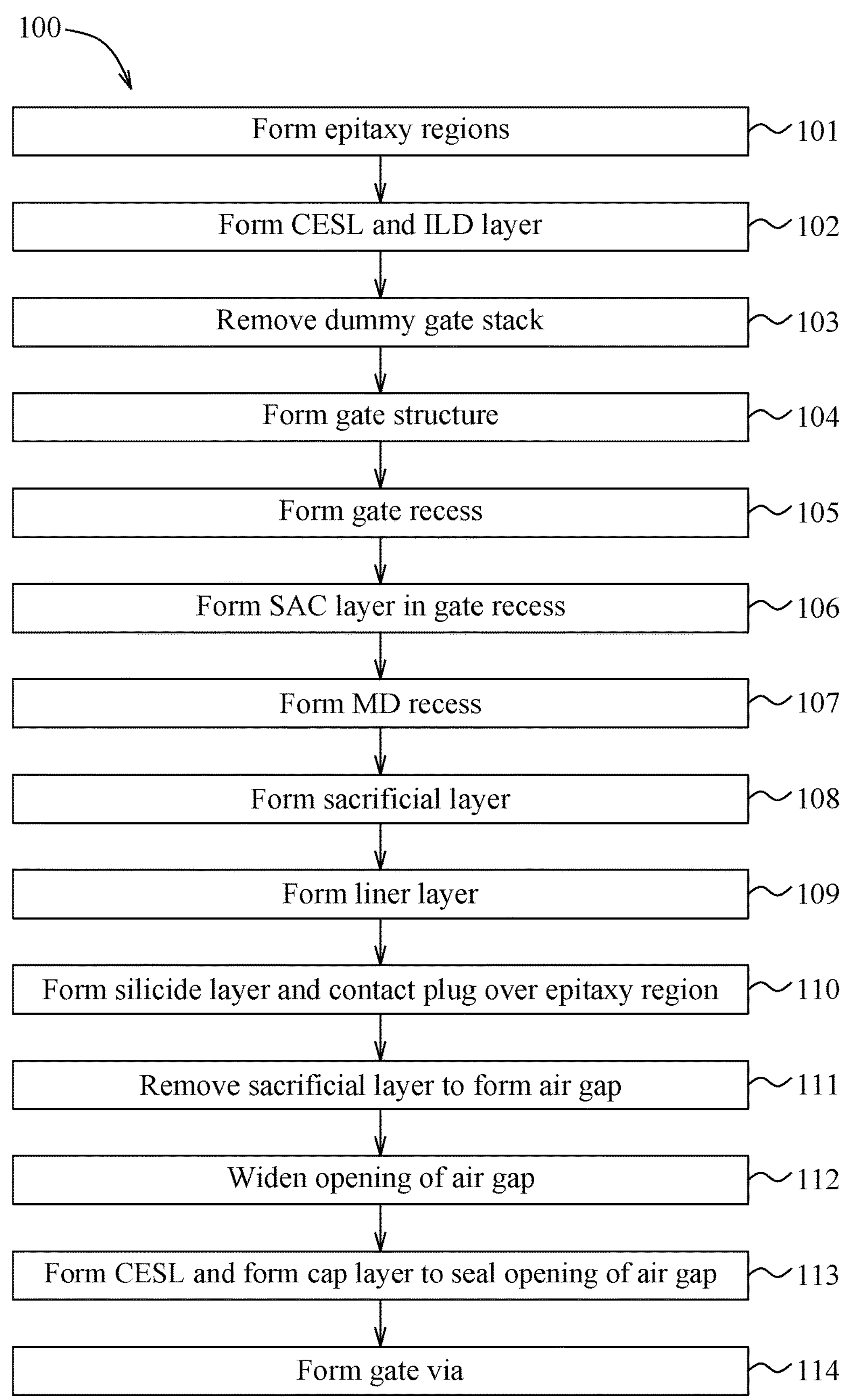
FIG. 1 is a flow diagram illustrating a method for manufacturing a semiconductor device with sealed air gaps according with some embodiments.
Figure 2:
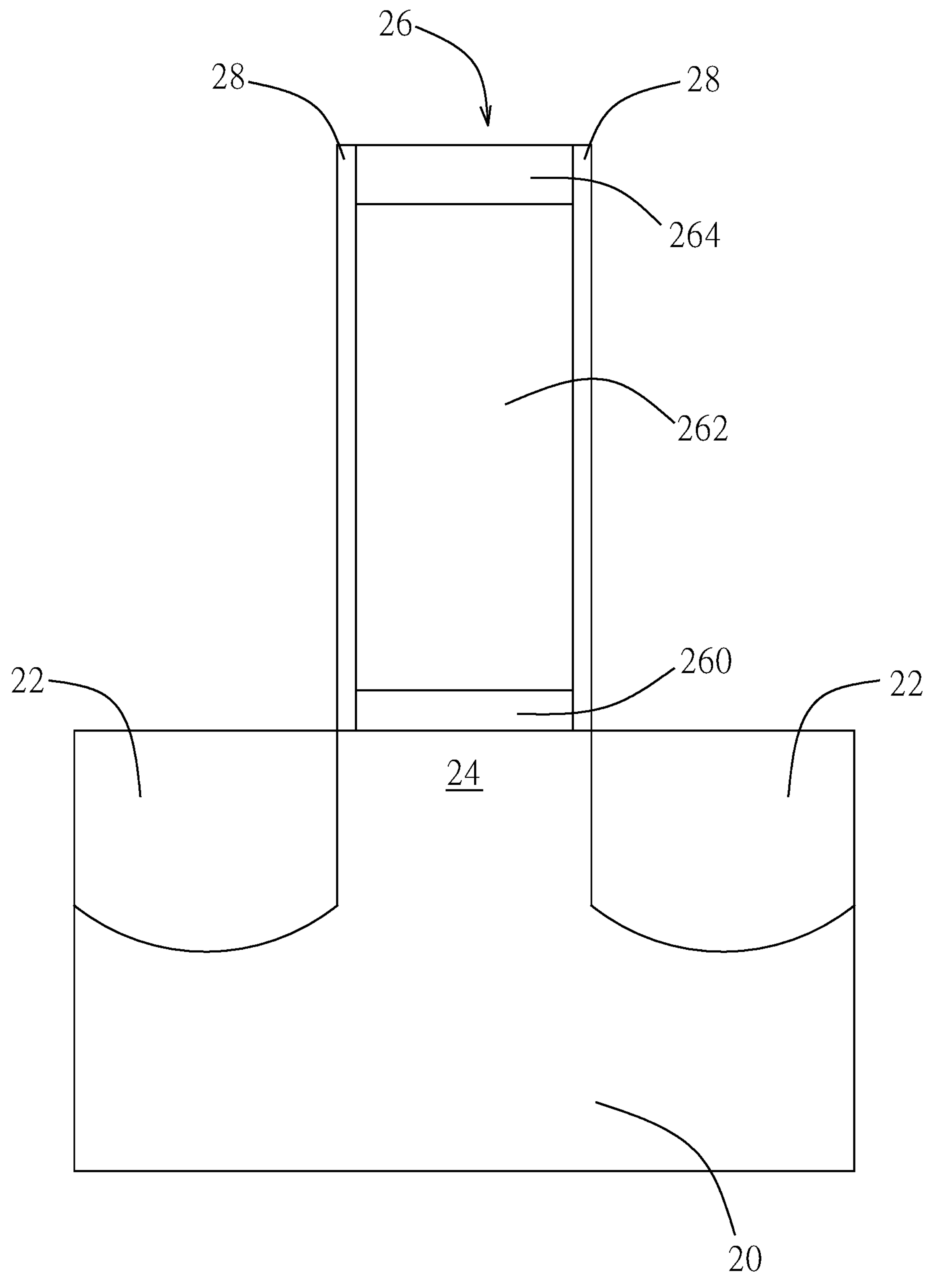
Figure 3:
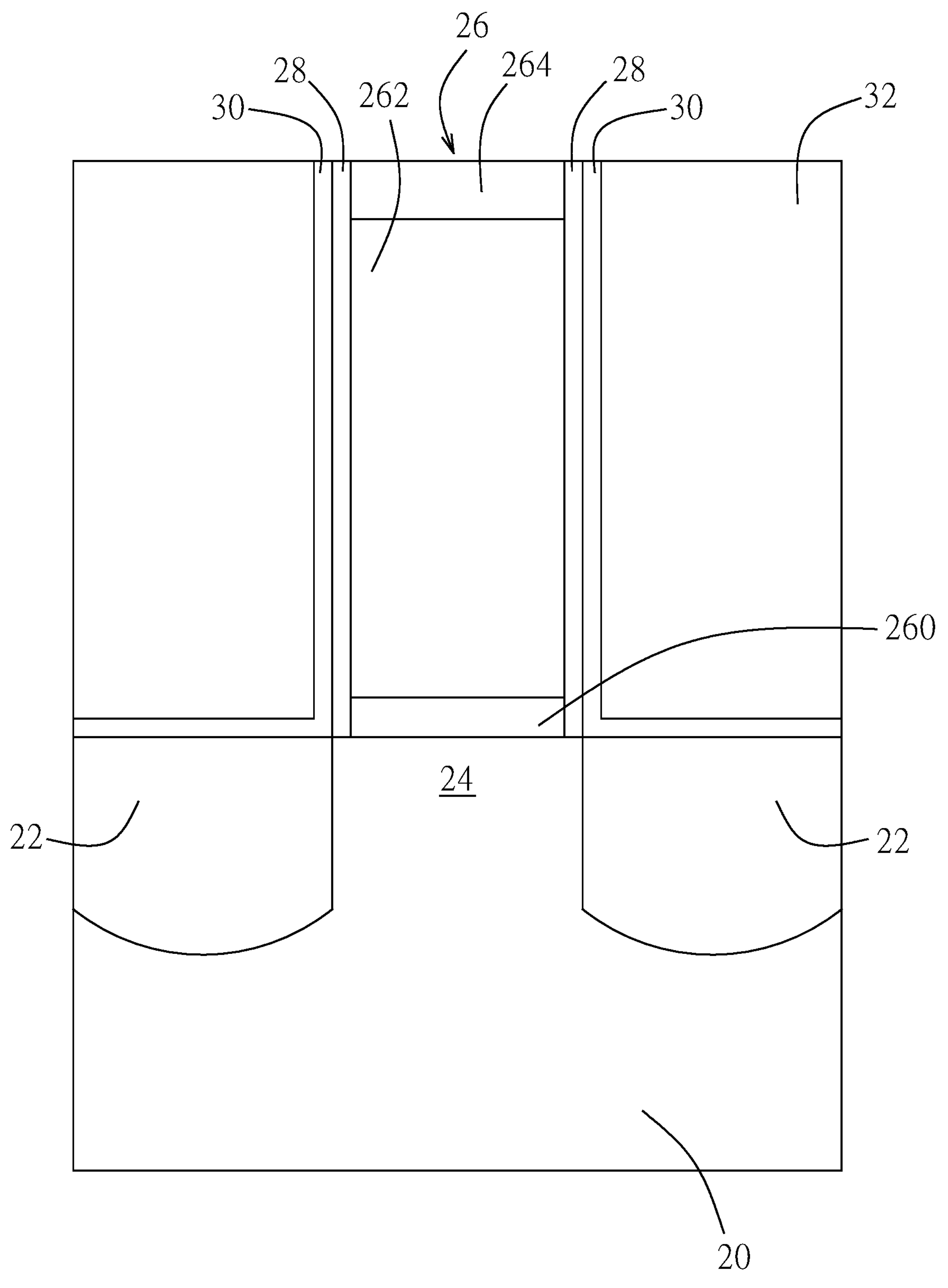
Figure 4:
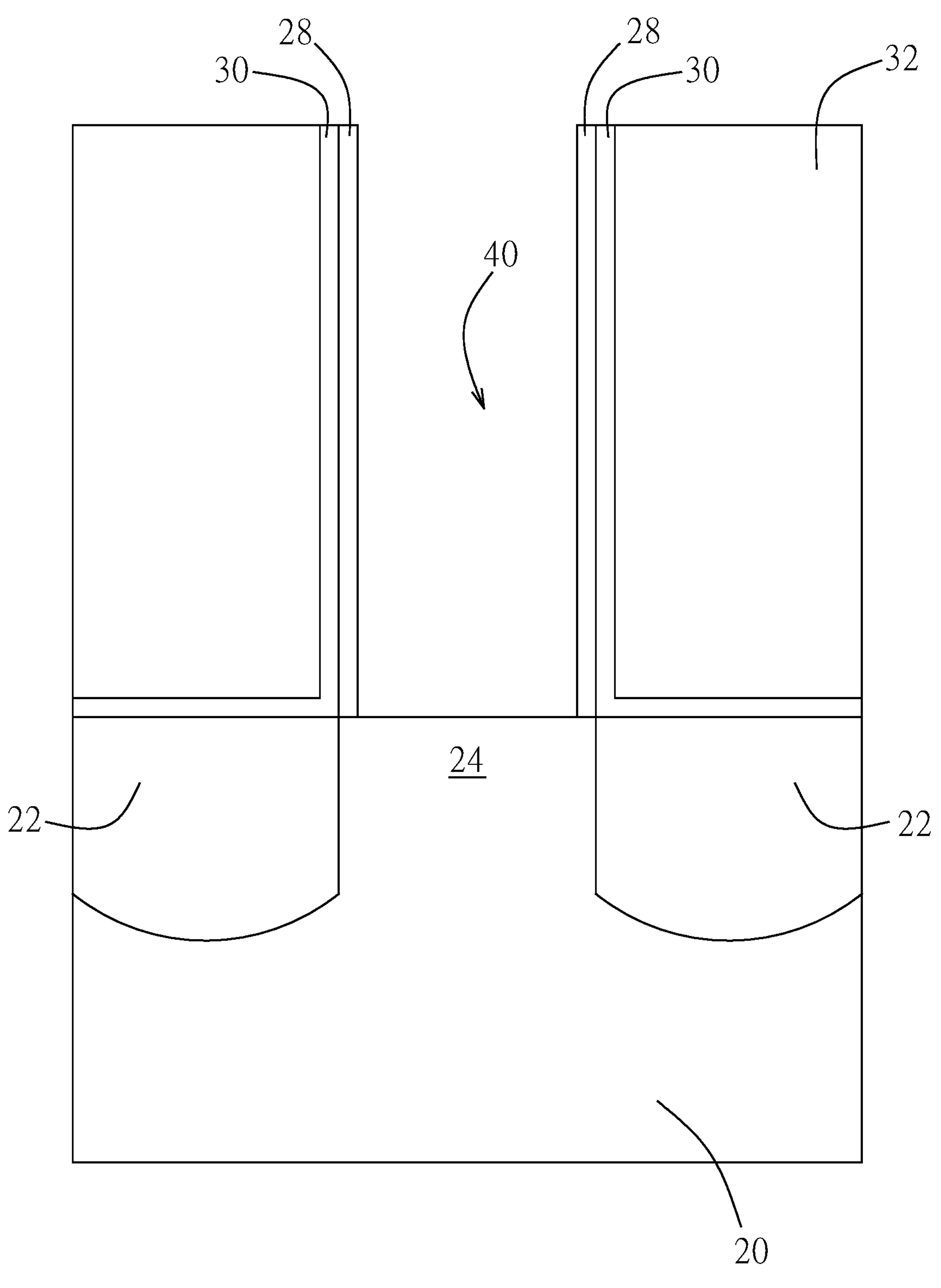
Figure 5:
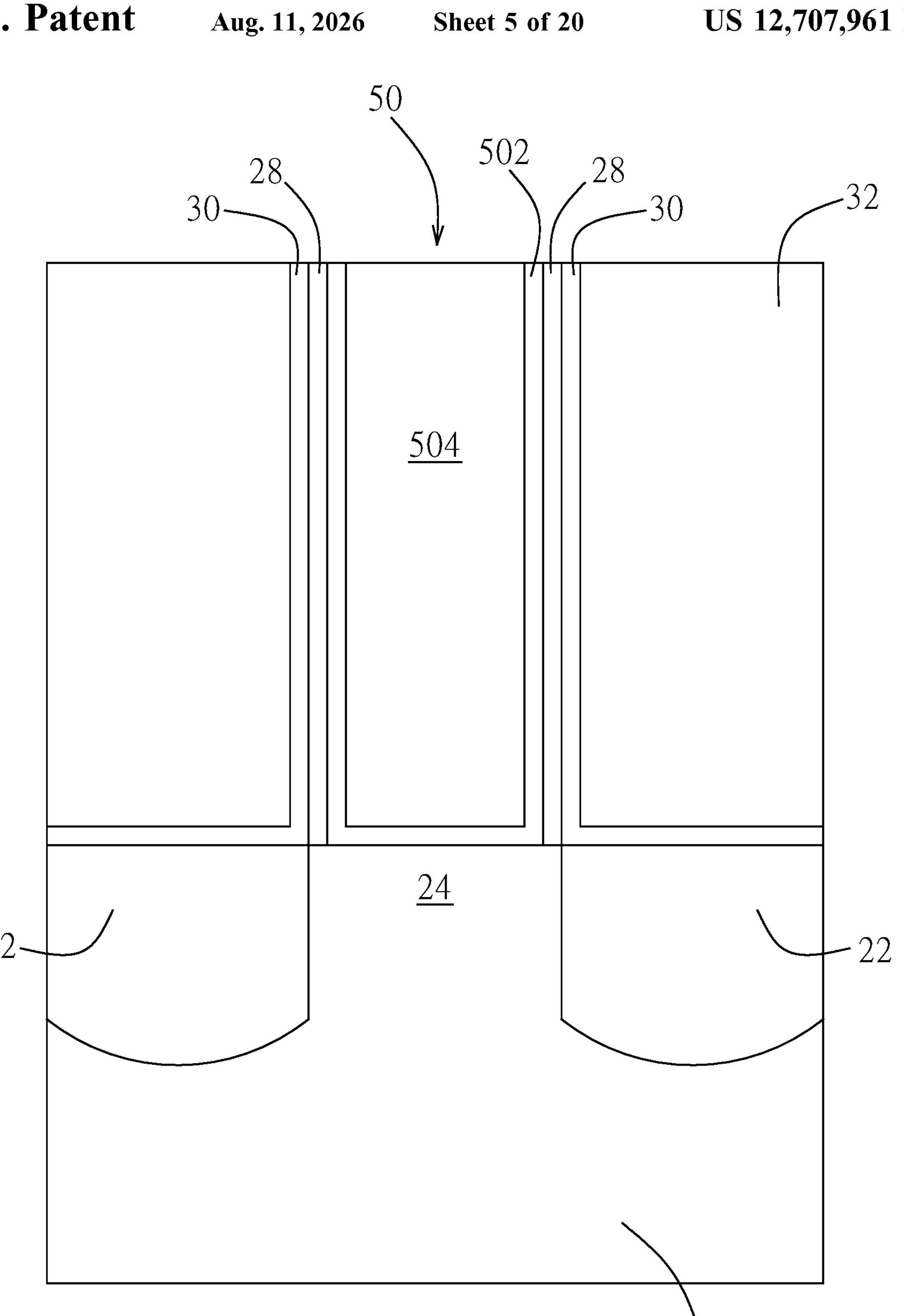
Figure 6:
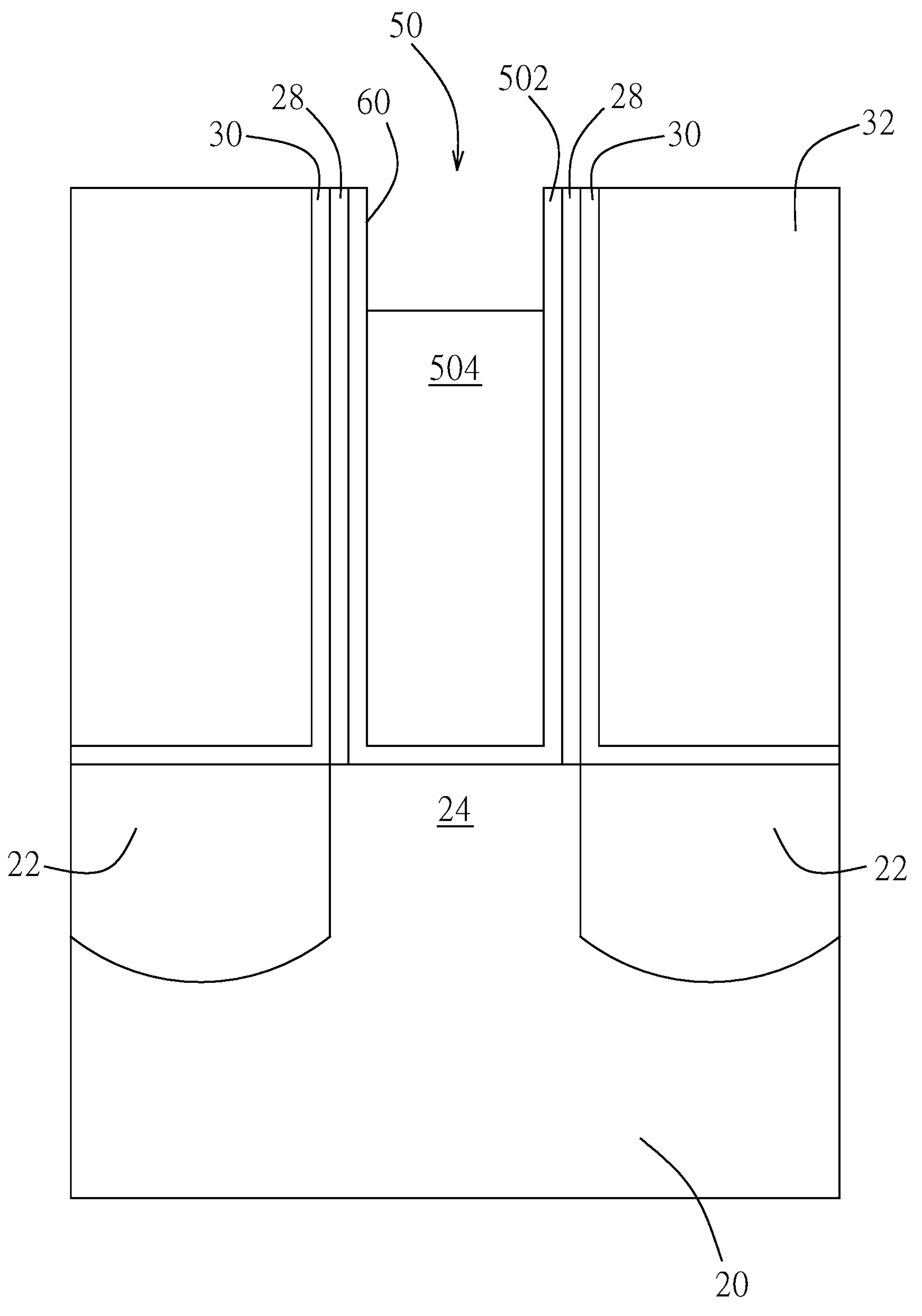
Figure 7:
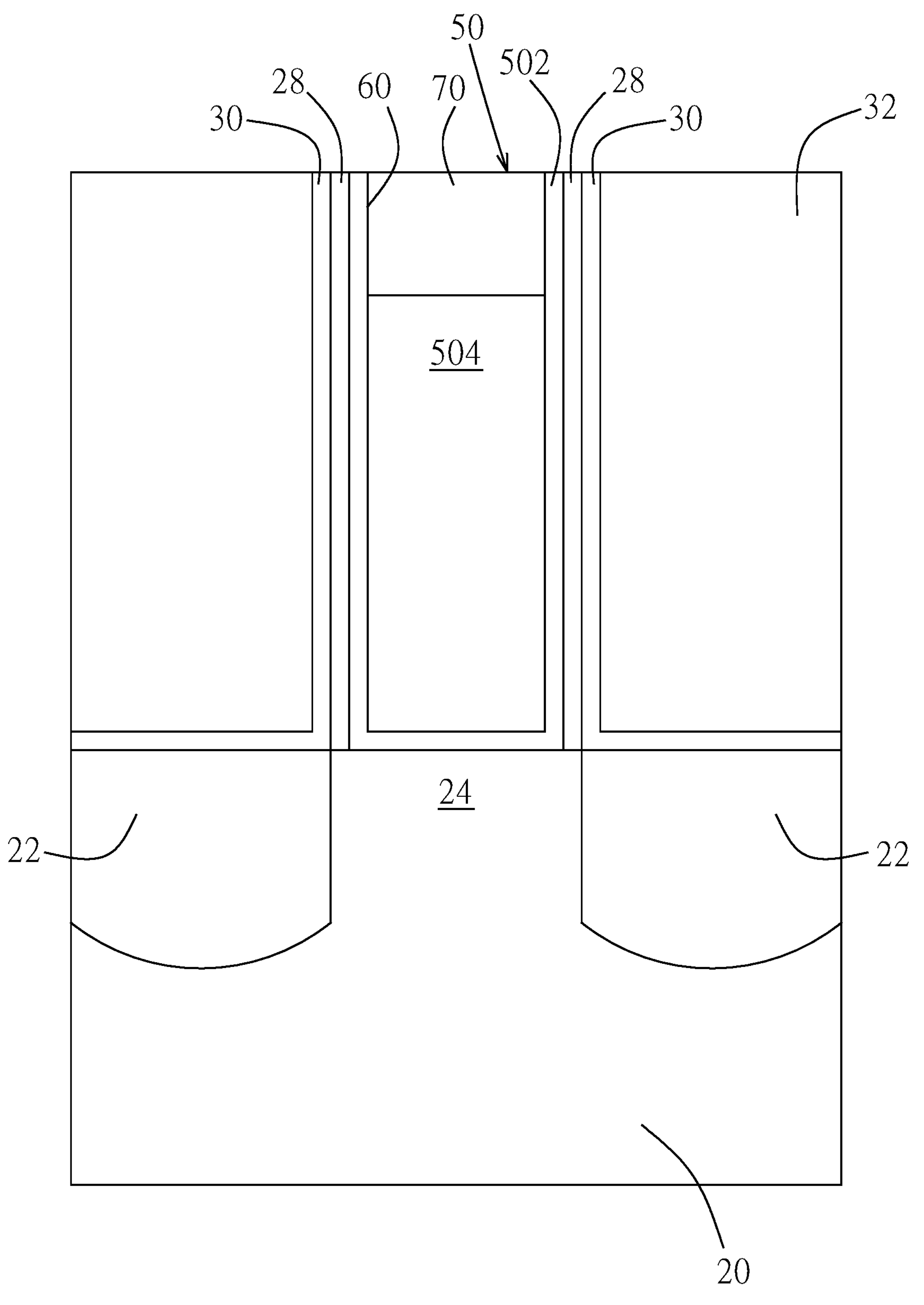
Figure 8:
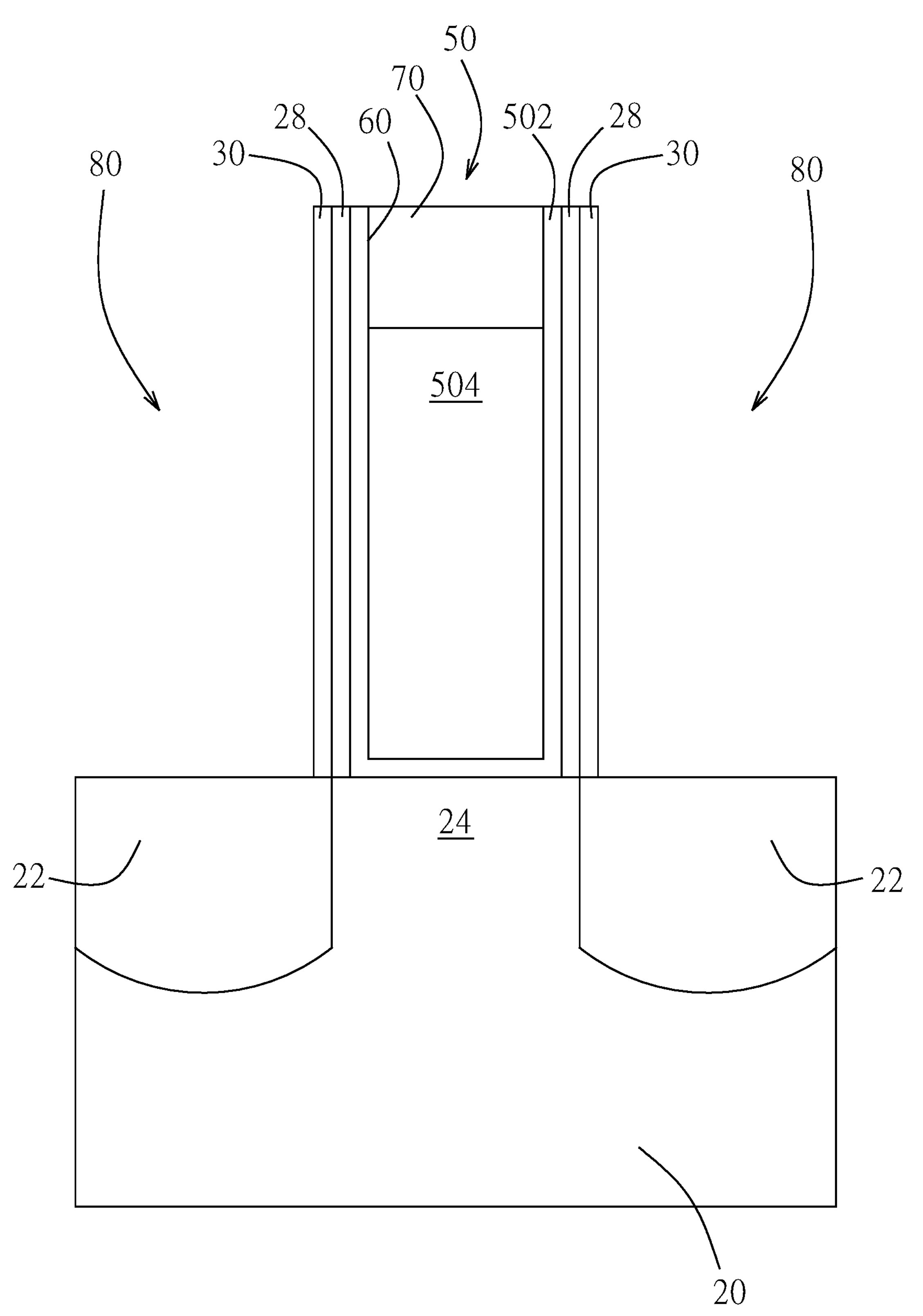
Figure 9:
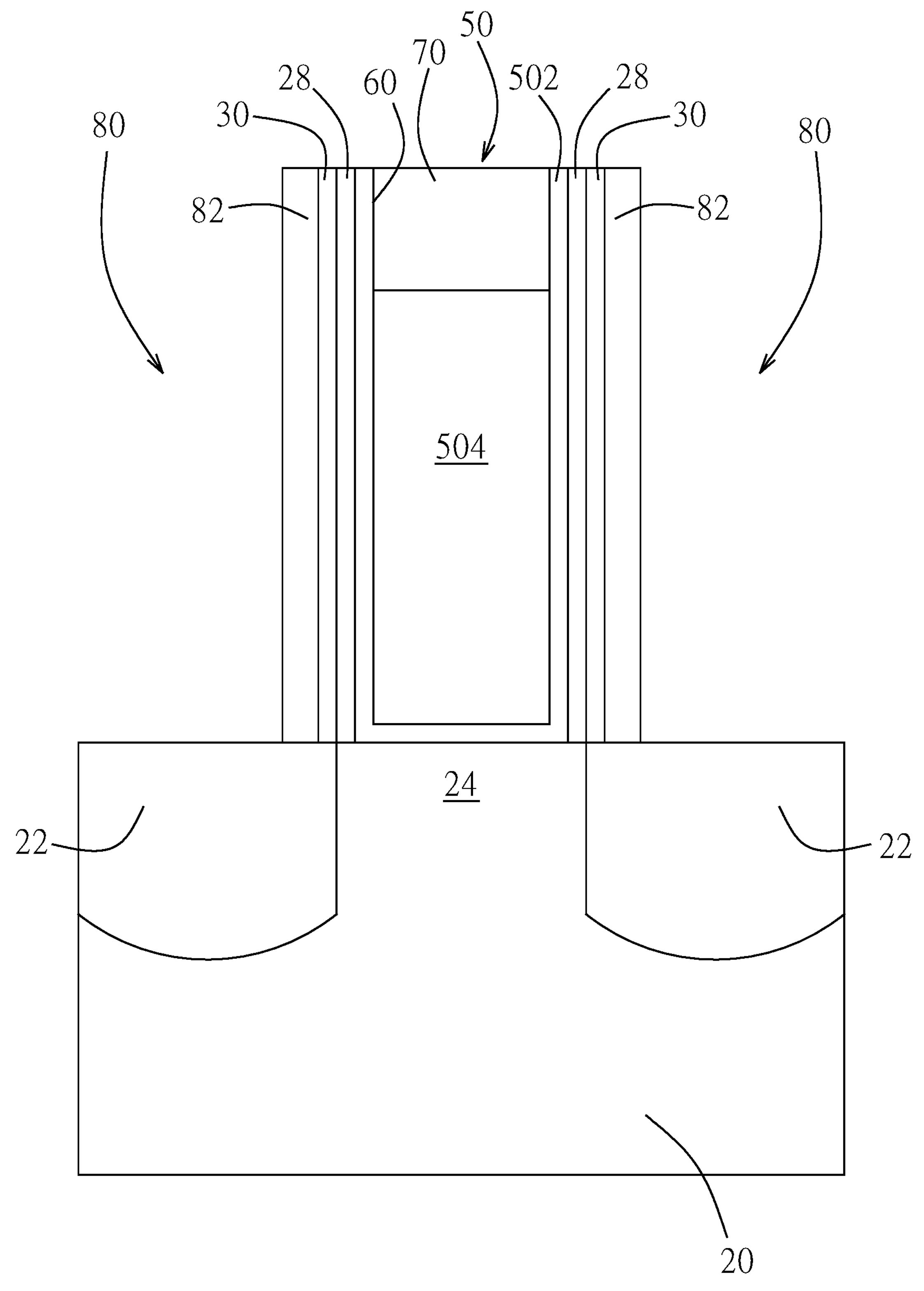
Figure 10:
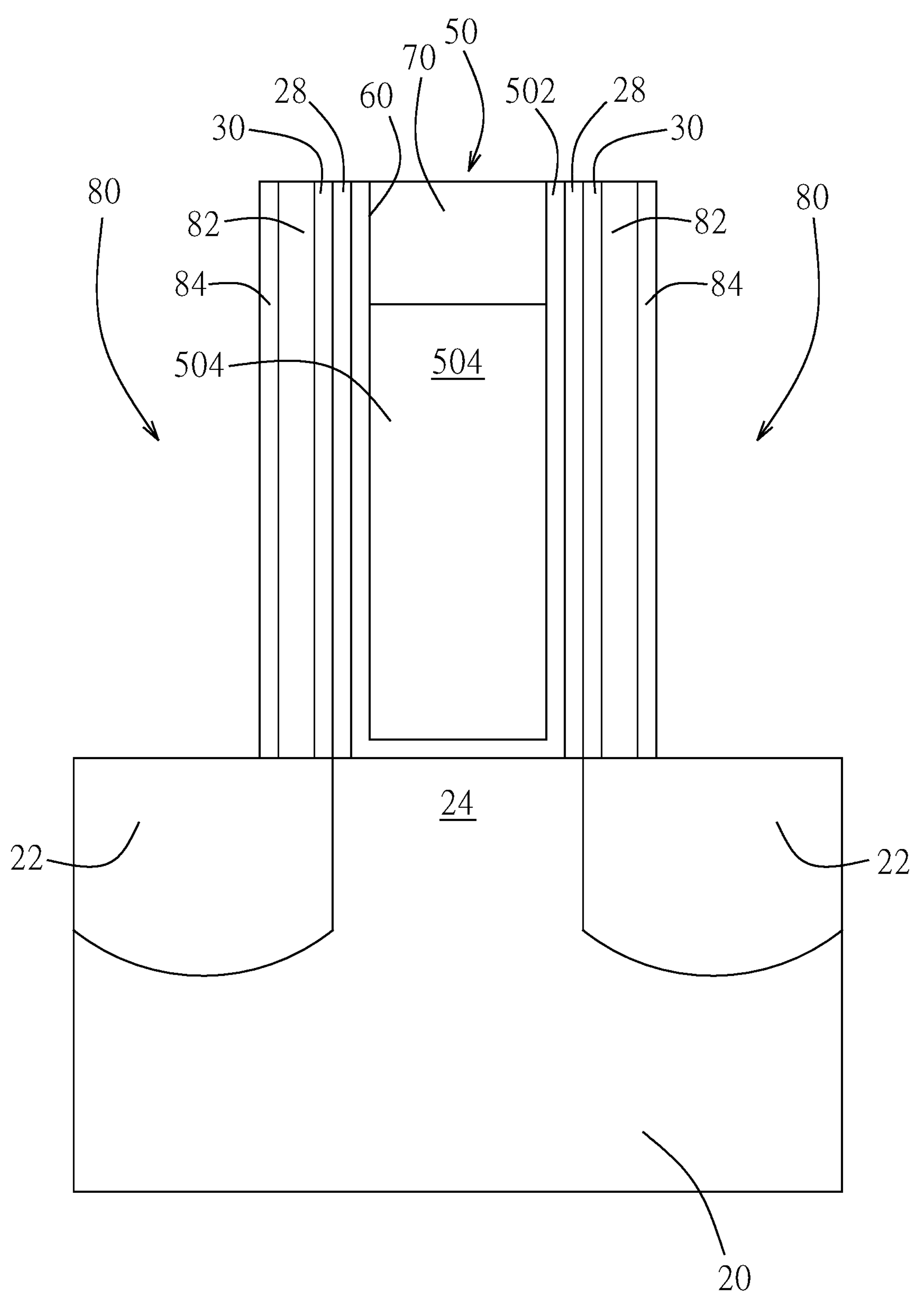

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "on," "over," "adjacent," "underneath," "beside" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The disclosure relates to forming a cap layer for sealing an opening of an air gap so as to prevent leakage between conductors. The disclosure may be applied in all semiconductor industries.

FIG. 1 is a flow diagram illustrating a method 100 for manufacturing a semiconductor device in accordance with some embodiments. In some embodiments, the semiconductor device may be a fin-type field effect transistor (FinFET) device. In some embodiments, the semiconductor device may be another technologically advanced semiconductor device, such as, but not limited to, a planar transistor device, a nano-sheet transistor device, a nano-wire transistor device, or another suitable device. FIGS. 2 to 18 illustrate schematic cross-sectional views along the longitudinal direction of a fin of an exemplary semiconductor device during various stages of the method 100 shown in FIG. 1. It is noted that although one gate structure and two epitaxy regions (i.e., source/drain regions) are exemplarily illustrated in FIGS. 2 to 18, the numbers of the gate structure and the epitaxy regions of the semiconductor device are not limited to these examples, and the semiconductor device may include an alternating arrangement of multiple gate structures and multiple epitaxy regions. The method 100 and the semiconductor device are collectively described below. However, additional steps can be provided before, after or during the various stages of the method 100, and some of the steps described herein may be replaced by other steps or be eliminated. Similarly, further additional features may be present in the semiconductor device, and/or some features in the semiconductor device obtained through the method 100 may be modified, replaced, or eliminated based on product design in other embodiments.

Referring to FIG. 1, the method 100 begins at step 101, where epitaxy regions (i.e., source/drain regions) are formed in recesses of a semiconductor substrate. Referring to the example illustrated in FIG. 2, epitaxy regions 22 are formed in recesses of a semiconductor substrate 20. The semiconductor substrate 20 is formed with a fin 24 which is located between the epitaxy regions 22. The semiconductor substrate 20 is further formed with a dummy gate stack 26 which is formed over the fin 24, and gate spacers 28 which are formed on sidewalls of the dummy gate stack 26. The dummy gate stack 26 may include a dummy gate dielectric layer 260 (e.g., silicon oxide), a dummy gate electrode 262 (e.g., polycrystalline silicon) disposed over the dummy gate dielectric layer 260, and at least one dummy gate hard mask 264 (e.g., silicon nitride) disposed over the dummy gate electrode 262. The semiconductor substrate 20 may be, for example, but not limited to, a silicon substrate, a silicon carbon substrate, a silicon germanium substrate, or a substrate made of other semiconductor materials, or a part of a wafer. The semiconductor substrate 20 may be non-doped or lightly-doped with an n-type impurity or a p-type impurity. The fin 24 may be, for example, but not limited to, made of the same material as the semiconductor substrate 20, and may have a width ranging from about 5 nanometers to 100 nanometers, a length ranging from about 20 nanometers to about 100 nanometers, and a height ranging from about 20 nanometers to about 60 nanometers. The gate spacers 28 may be formed of a dielectric material such as, but not limited to, a silicon-carbon-containing material (e.g., silicon carbide, silicon carbon nitride or SiCO), nitride, silicon nitride, or the like, and may each have a single-layer structure or a multi-layer structure that includes a plurality of dielectric layers. The gate spacers 28 may be formed through, for example, a blanket deposition process and an anisotropic etching process, and may each have a thickness ranging from about 1 nanometer to about 6 nanometers. The epitaxy regions 22 are formed in the recesses through a selective epitaxial growth (SEG) process.

In some embodiments, the epitaxy regions 22 include crystalline silicon (or other suitable materials) in-situ doped with an n-type impurity or a p-type impurity during the SEG process depending on whether the FinFET is a p-type FinFET or an n-type FinFET. When the FinFET is an n-type FinFET, the n-type impurity may be, for example, but not limited to, phosphorous, nitrogen, arsenic, antimony, other suitable materials, or combinations thereof, and in some embodiments, silicon phosphorous (Sip) or silicon carbon phosphorous (SiCP) may be grown to form the epitaxy regions 22. On the other hand, when the FinFET is a p-type FinFET, the p-type impurity may be, for example, but not limited to, germanium, boron, aluminum, gallium, indium, $BF_2$, other suitable materials, or combinations thereof, and in some embodiments, silicon germanium boron (SiGeB) may be grown to form the epitaxy regions. In accordance with alternative embodiments of the present disclosure, epitaxy regions include III-V compound semiconductors such as GaAs, InP, GaN, InGaAs, InAlAs, GaSb, AlSb, AlAs, Alp, GaP, combinations thereof, and each of the epitaxy regions may have multi-layers of the compound semiconductors. After step 101, a channel region is disposed between the epitaxy regions 22. Each of the epitaxy regions 22 may include one or multiple layers. For the epitaxy regions 22 that include multiple layers, an outermost layer thereof may serve as a sacrificial layer.

Referring to FIG. 1, the method 100 then proceeds to step 102, where a contact etch stop layer (CESL) material is formed over a structure of the semiconductor device which has undergone the stage of step 101, an interlayer dielectric (ILD) layer is then formed over the CESL material, and the ILD layer is planarized. Referring to the example illustrated in FIG. 3, a CESL material (not shown) is formed over the dummy gate stack 26, the gate spacers 28 and the epitaxy regions 22, an ILD layer 32 is then formed over the CESL material, and the ILD layer 32 is planarized, where a portion of the CESL material is removed during the planarization to expose the dummy gate stack 26 and to form contact etch stop layers (CESLs) 30 on sidewalk of the gate spacers 28 and over the epitaxy regions 22. Since the CESLs 30 are located at a bottom part of the semiconductor device created after the method is completed, the CESLs 30 are referred to as bottom CESLs (BCESLs) 30 hereinafter. The CESL material may include, for example, but not limited to, silicon nitride, carbon-doped silicon nitride, silicon carbon nitride, other suitable materials, or combinations thereof, and may be formed using a blanket deposition process, such as, but not limited to, chemical vapor deposition (CVD), molecular layer deposition (MLD), atomic layer deposition (ALD), plasma enhanced atomic layer deposition (PEALD), other suitable methods, or combinations thereof. In certain embodiments, the CESL material is conform ally formed on the epitaxy regions 22, the gate spacers 28 and the dummy gate stack 26, and may have a thickness ranging from about 2 nanometers to about 5 nanometers. The ILD layer 32 may include a dielectric material such as, but not limited to, oxide, silicon oxide, a low-k material, other suitable materials, or combinations thereof. The ILD layer 32 may be formed by blanket depositing a layer of the dielectric material using, for example, but not limited to, CVD, high density plasma CVD (HDPCVD), subatmospheric CVD (SACVD), MLD, flowable chemical vapor deposition (FCVD), spin-on coating, other suitable methods, or combinations thereof. The ILD layer 32 is planarized by using, for example, but not limited to, chemical mechanical polishing (CMP), other suitable methods, or combinations thereof, to expose the dummy gate hard mask 264 of the dummy gate stack 26, and the gate spacers 28.

Referring to FIG. 1, the method 100 then proceeds to step 103, where the dummy gate stack is removed to form a recess. Referring to the example illustrated in FIG. 4, the dummy gate hard mask 264, the dummy gate electrode 262 and the dummy gate dielectric layer 260 of the dummy gate stack 26 are removed to form a recess 40 so that a top surface of the fin 24 originally underneath the dummy gate stack 26 (see FIG. 3) is exposed from the recess 40. Step 103 may be implemented through a known etching process in the art, such as, but not limited to, a dry etching process, a wet etching process, other suitable processes, or combinations thereof.

Referring to FIG. 1, the method 100 then proceeds to step 104, where a gate structure is formed in the recess. Referring to the example illustrated in FIG. 5, a gate dielectric layer 502 and a gate electrode 504 are sequentially formed over a top surface of the ILD layer 32 and to fill in the recess 40 shown in FIG. 4 through a blanket deposition process using CVD, HDPCVD, SACVD, MLD, physical vapor deposition (PVD), ALD, sputtering, other suitable methods, or combinations thereof, followed by a planarization process so as to form a gate structure 50 in the recess 40. The gate structure 50 includes the gate dielectric layer 502. and the gate electrode 504. A top surface of the gate structure 50 is level with the top surface of the ILD layer 32.

In some embodiments, the gate dielectric layer may include, from interior to exterior, an interlayer dielectric sublayer (which may include, but not limited to, silicon oxide, silicon nitride, silicon oxynitride, other suitable materials, or combinations thereof) and a sublayer of high dielectric constant (k) material, such as, but not limited to, hafnium oxide, lanthanum oxide, aluminum oxide, zirconium oxide, or other suitable materials. The gate electrode may include, from interior to exterior, a barrier layer (not shown, which may prevent diffusion of a metal into the gate dielectric layer and may include aluminum, titanium, tantalum, other suitable materials, or combinations thereof), a work function layer (not shown), and a filling material layer (not shown, which may include, but not limited to, aluminum, tungsten, copper, other conductive metals, or combinations thereof). Material of the work function layer may be selected according to whether the FinFET is an n-type FinFET or a p-type FinFET. For the n-type FinFET, the work function layer is an n-type work function layer which may include, but not limited to materials such as, titanium, aluminum, tantalum carbide, tantalum carbide nitride, tantalum silicon nitride, other suitable materials, or combinations thereof. For the p-type FinFET, the work function layer is a p-type work function layer which may include, but not limited to materials such as, titanium nitride, tantalum nitride, ruthenium, molybdenum, tungsten, platinum, other suitable materials, or combinations thereof.

Referring to FIG. 1, the method 100 then proceeds to step 105, where a gate electrode of the gate structure is recessed to form a gate recess. Referring to the example illustrated in FIG. 6, the gate electrode 504 is recessed through an etch-back process to form a gate recess 60. The etch-back process may be implemented by, for example, but not limited to, a dry etching process, a wet etching process, other suitable processes, or combinations thereof. In some embodiments, the etch-back process is performed using an etchant that attacks the gate electrode 504, but does not attack the gate dielectric 502, the gates spacers 28, the BCESLs 30 and the ILD layer 32. In some embodiments, the etchant may be implemented by, but is not limited to, a chlorine-based or fluorine-based etchant.

Referring to FIG. 1, the method 100 then proceeds to step 106, where a self-aligned contact (SAC) layer is formed in the gate recess. Referring to the example illustrated in FIG. 7, a SAC film (not shown) is first formed on the ILD layer 32 and fills in the gate recess 60 of the gate structure 50, and a planarization process is then conducted to remove the excess of the SAC film on the ILD layer 32 outside the gate recess 60, so as to obtain a SAC layer 70 in the gate recess 60 of the gate structure 50. In some embodiments, the SAC film may include a material which has an etch rate different from (e.g., lower than) that of the dielectric material of the ILD layer 32. The material for the SAC film may include, for example, but not limited to, silicon nitride, silicon carbon nitride, silicon oxycarbide, silicon oxycarbonitride, SiCO, other suitable materials, or combinations thereof. The SAC film may be conformally deposited by, for example, but not limited to, ALD, PEALD, plasma-enhanced chemical vapor deposition (PECVD), PVD, sputtering, plating, other suitable techniques, or combinations thereof. In some embodiments, the SAC layer 70 may serve as an isolation layer or an etch-stop layer for a subsequent MD (an abbreviation for "metal-to-device") etching process to protect the gate electrode 504 underneath the SAC layer 70. The SAC layer 70 may have a width ranging from about 15 nanometers to about 60 nanometers, a length ranging from about 25 nanometers to about 200 nanometers, and a height ranging from about 20 nanometers to about 60 nanometers. The planarization process of step 106 may be implemented using a CMP process or other suitable techniques. In some embodiments, a top surface of the SAC layer 70 may be coplanar with the top surface of the ILD layer 32 and with top surfaces of the gate spacers 28.

Referring to FIG. 1, the method 100 then proceeds to step 107, where MD recesses are formed. Referring to the example illustrated in FIG. 8, an MD etching process is conducted to etch the ILD layer 32 and portions of the BCESLs 30 over the epitaxy regions 22 shown in FIG. 7 using an MD hard mask (not shown) to form MD recesses 80. The term "MD etching" stands for a process for forming recesses that are to be filled with a conductive material in the subsequent step. It is noted that since the ILD layer 32 has an etch rate higher than those of the SAC layer 70 and the gate spacers 28, after the MD etching process is completed, the MD recesses 80 may be created beside the gate structure 50 on which the SAC layer 70 is disposed. The MD recesses 80 are formed to expose the epitaxy regions 22. Step 107 may be implemented using a known process in the art, such as, but not limited to, a dry etching process (e.g., a plasma etching process), or other suitable processes. In some embodiments, the MD hard mask may be formed by patterning a hard mask film using a photolithography process and an etching process. The photolithography process may include, for example, but not limited to, coating a photoresist, soft-baking, exposing the photoresist through a photomask, post-exposure baking, and developing the photoresist, followed by hard-baking, so as to form a patterned photoresist. The etching process may be implemented by etching the hard mask film through the patterned photoresist using, for example, but not limited to, a dry etching process, a wet etching process, other suitable processes, or combinations thereof. After step 107, the MD hard mask may be removed.

Referring to FIG. 1, the method 100 then proceeds to step 108, where sacrificial layers are formed on sidewalls of the BCESLs. Referring to the example illustrated in FIG. 9, a sacrificial film (not shown) is first formed on a structure of the semiconductor device which has undergone the stage of step 107, and an etching process is then conducted to remove top and bottom portions of the sacrificial film so that remaining portions of the sacrificial film on the sidewalls of the BCESLs 30 form the sacrificial layers 82. The top and bottom portions of the sacrificial film are the portions of the sacrificial film on top surfaces of the SAC layer 70, the gate dielectric 502, the gate spacers 28, the BCESLs 30 and the epitaxy regions 22. In some embodiments, the sacrificial film may include a material which has an etch rate higher than those of the dielectric and metal materials in the semiconductor device so that the sacrificial layer may be removed in a later stage without substantially damaging other elements of the semiconductor device which is made of dielectric and metal materials. The material for the sacrificial film may include, for example, but not limited to, silicon, silicon oxide, or other suitable materials. The sacrificial film may be conformally deposited by, for example, but not limited to, ALD, CVD, other suitable techniques, or combinations thereof, which may be performed by using a furnace deposition system. In some embodiments, the sacrificial layers 82 may each have a thickness ranging from about 1 nanometer to about 5 nanometers. The etching process for removing the top and bottom portions of the sacrificial film may be implemented by, for example, but not limited to, a dry etching process, such as reactive-ion etching or plasma etching, other suitable processes, or combinations thereof. In some embodiments where the etching process is implemented by plasma etching, a plasma of reactive gases, such as, but not limited to hydrogen bromide (HBr), chlorine, other suitable gases, or combinations thereof, is used to remove the top and bottom portions of the sacrificial film.

Referring to FIG. 1, the method 100 then proceeds to step 109, where liner layers are formed on sidewalls of the sacrificial layers. Referring to the example illustrated in FIG. 10, a liner film (not shown) is first formed on a structure of the semiconductor device which has undergone the stage of step 108, and an etching process is then conducted to remove top and bottom portions of the liner film so that remaining portions of the liner film on the sidewalls of the sacrificial layers 82 form the liner layers 84. The top and bottom portions of the liner film are the portions of the liner film on top surfaces of the SAC layer 70, the gate dielectric 502, the gate spacers 28, the BCESLs 30, the sacrificial layers 82 and the epitaxy regions 22. In some embodiments, the liner film may include, for example, but not limited to, silicon nitride, carbon-doped silicon nitride, silicon carbon nitride, other suitable materials, or combinations thereof. The liner film may be conformally deposited by, for example, but not limited to, ALD, PEALD, PECVD, other suitable techniques, or combinations thereof, which may be performed by using a furnace deposition system. Alternatively, the liner film may be deposited in a non-conformal manner. In some embodiments, the liner layers 84 may each have a thickness ranging from about 2 nanometers to about 4 nanometers. The etching process for removing the top and bottom portions of the liner film may be implemented by, for example, but not limited to, a dry etching process, such as reactive-ion etching or plasma etching, other suitable processes, or combinations thereof. In some embodiments where the etching process is implemented by plasma etching, a plasma of reactive gases, such as, but not limited to hydrogen bromide, chlorine, other suitable gases, or combinations thereof, is used to remove the top and bottom portions of the liner film.

Referring to FIG. 1, the method 100 then proceeds to step 110, where silicide layers are respectively formed on the epitaxy regions, and contact plugs are respectively formed on the silicide layers. Referring to the example illustrated in FIG. 11, silicide layers 86 are respectively formed on the epitaxy regions 22 exposed from the MD recesses 80 shown in FIG. 10, a conductive material is then applied to fill the MD recesses 80, and a planarization process is ultimately performed to remove excesses of the conductive material so as to form contact plugs 88 in the respective MD recesses 80 and on the respective silicide layers 86.

In some embodiments, the silicide layers may include silicon and at least one metal element including, for example, but not limited to, aluminum, titanium, nickel, cobalt, other suitable materials, or combinations thereof. The silicide layers may be formed by first forming a metal layer that contains the metal element on the epitaxy regions (source/drain regions) followed by an annealing process. In some embodiments, the metal layer may be applied using PVD, sputtering, low pressure CVD (LPCVD), atomic layer chemical vapor deposition (ALCVD), electroless plating, other suitable methods, or combinations thereof. The annealing may be performed using thermal annealing, flash annealing, laser annealing, and the like. The conductive material for the contact plugs may include a metal material such as, but not limited to, cobalt, copper, ruthenium, tungsten, other suitable materials, or combinations thereof. In some embodiments, the planarization may be implemented using, for example, but not limited to, chemical mechanical polishing (CMP), other suitable methods, or combinations thereof. Each of the contact plugs may have a width ranging from about 10 nanometers to about 100 nanometers, a length ranging from about 25 nanometers to about 200 nanometers, and a height ranging from about 30 nanometers to about 80 nanometers.

Referring to FIG. 1, the method 100 then proceeds to step 111, where the sacrificial layers are removed to form air gaps. Referring to the example illustrated in FIG. 12, the sacrificial layers 82 (see FIG. 11) are removed using an etching process, such as, but not limited to, a dry etching process, a wet etching process, other suitable processes, or combinations thereof, so as to form air gaps 90 each between the gate structure 50 and a respective one of the contact plugs 88. Each of the air gaps 90 may be bordered at one of the BCESLs 30 and a corresponding one of the liner layers 84 adjacent to the BCESL 30, and may have a width (i.e., the clearance between the BCESL 30 and the corresponding liner layer 84) ranging from about 1 nanometer to about 5 nanometers. Each of the air gaps 90 has an opening opposite to the corresponding epitaxy region 22. In some embodiments, the etching process may be implemented through a wet chemical etching process with a wet chemical etchant, such as, but not limited to, an ammonia solution, i.e., $NH_4OH$(aq), which is a solution of ammonia in water and may have a concentration of about 0.1% to 30% by volume or by weight at a temperature between about 20° C. to about 80° C. It is noted that since the wet chemical etching process using the ammonia solution has a high etching selectivity to silicon over other dielectric and metal materials in the semiconductor device, the air gaps 90 may be formed without substantially damaging other elements of the semiconductor device which is made of dielectric and metal materials. Because of the relatively low dielectric constant (approximately 1.0) of air in the air gaps, device capacitance between the gate structure and each contact plug would be reduced.

Referring to FIG. 1, the method 100 then proceeds to step 112, where upper ends of the BCESLs and the liner layers are etched back to widen openings of the air gaps. Referring to the example illustrated in FIG. 13, upper ends of the BCESLs 30 and the liner layers 84 are etched back through an etching process in such a manner that corners of the upper ends are rounded off (may be referred to as upper corner rounding). In this way, the opening of each of the air gaps 90 may be widened, and gradually narrows from top to bottom, forming a substantially funnel shape in the cross-sectional view. In some embodiments, the etching process for etching back the upper ends of the BCESLs and the liner layers may be anisotropic etching, and may be implemented by, for example, but not limited to, a dry etching process, such as reactive-ion etching or plasma etching, other suitable processes, or combinations thereof. It is noted that since the etching back is performed on the upper ends of the BCESLs and the liner layers, the widths of the air gaps may remain unchanged except at the openings.

In some embodiments where the BCESLs and the liner layers all include silicon nitride and where the etching process for etching back the upper ends is implemented by plasma etching, a plasma of reactive gases, such as, but not limited to, gases containing fluorine, like $CF_4$, $NF_3$, $CHF_3$, $CH_3F$, $CH_2F_2$, $C_4F_6$, $C_4F_8$ and $SF_6$, other suitable gases, or combinations thereof, may be used, and in some cases in mixture with other additional gases, such as, but not limited to, oxygen, nitrogen, hydrogen, argon, and carbon monoxide. The plasma etching may be carried out with a gas pressure that may be set lower than about 500 mTorr, with a process temperature that may be set lower than about 100° C., with a gas flow of about 20 sccm to about 1000 sccm, with radio frequency (RF) power of about 30 watts to about 3000 watts, and with a bias voltage of about 30 V to about 500 V. It is noted that when the SAC layer also includes silicon nitride, the SAC layer may be slightly etched during the plasma etching, but the height of the SAC layer may not be significantly affected because the plasma etching is merely performed for a short time to round off corners of the upper ends of the BCESLs and the liner layers.

Figure 13:
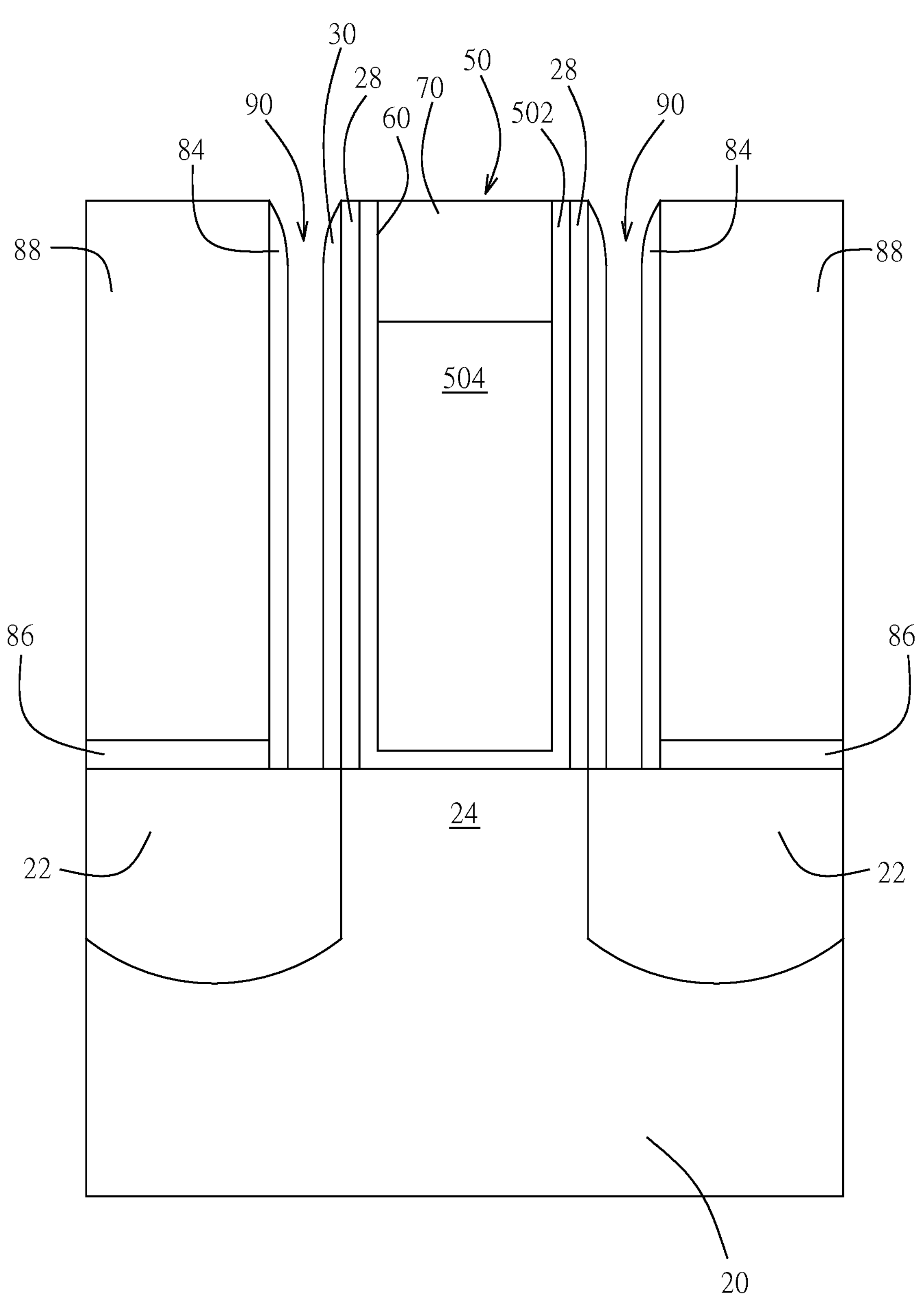
Figure 14:
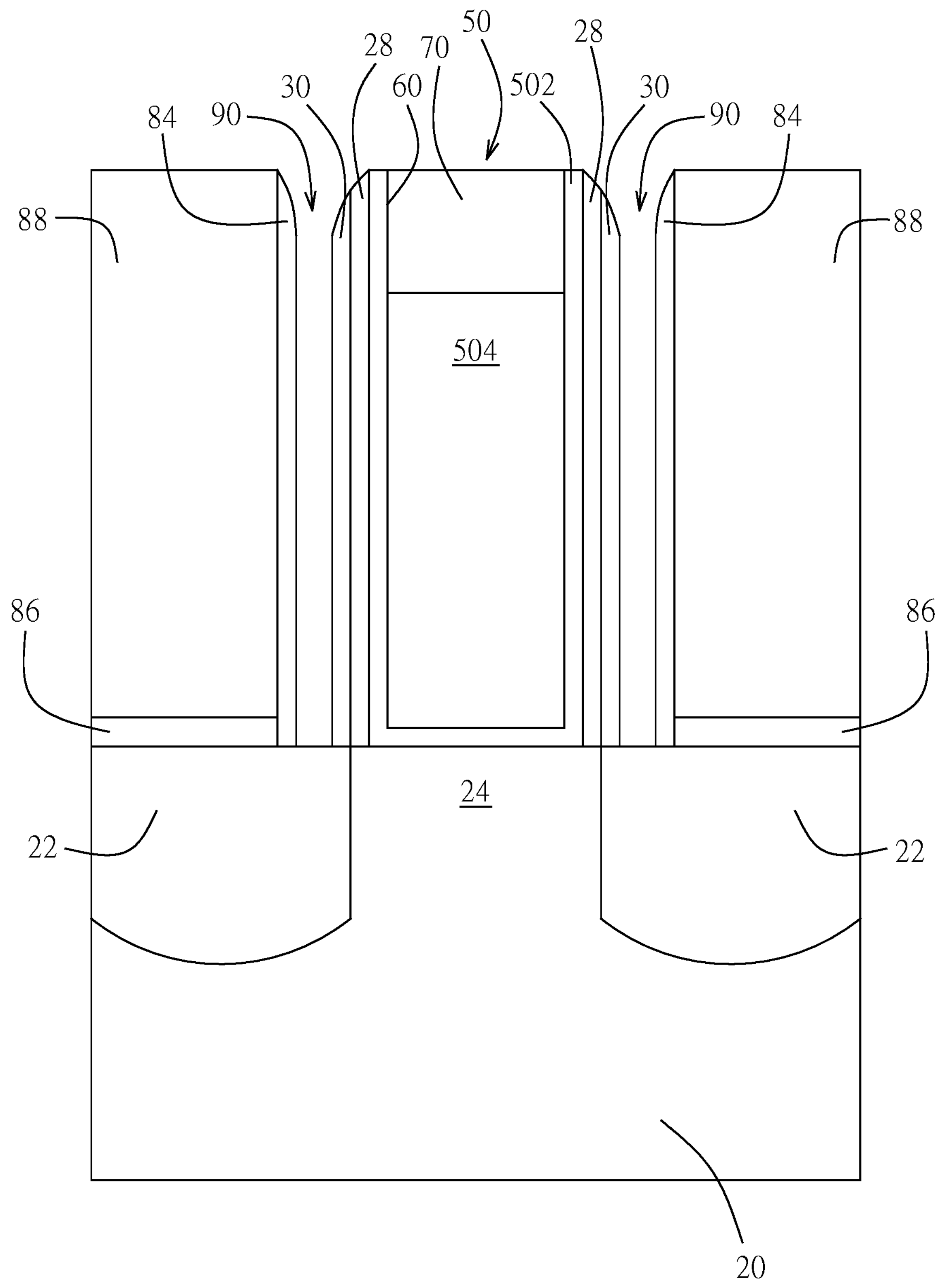

Referring to FIG. 14, which illustrates a variation of the example shown in FIG. 13, upper ends of the gate spacers 28 are also etched back in addition to the upper ends of the BCESLs 30 and the liner layers 84 through an etching process in such a manner that corners of the upper ends are rounded off. It is noted that since the etching process may have an etch rate for the material of the gate spacers (e.g., SiC, SiCO or SiCN) similar to that for the material of the BCESLs and the liner layers (e.g., silicon nitride), the upper ends of the gate spacers may have their corners rounded off like the upper ends of the BCESLs and the liner layers. In this way, the openings of the air gaps may be further widened.

Referring to FIG. 1, the method 100 then proceeds to step 113, where another CESL is formed over a structure of the semiconductor device which has undergone the stage of step 112 where the openings of the air gaps are widened. Since the CESL would be located at a middle part of the semiconductor device created after the method is completed, this CESL is referred to as a middle CESL (MCESL) hereinafter. Referring to the example illustrated in FIG. 15, which continues from the example of FIG. 14, an MCESL 92 is formed over the SAC layer 70 and the contact plugs 88, and partially fills the air gaps 90 so as to form cap layers 920 to seal the openings of the air gaps 90. It is noted that since the openings of the air gaps 90 thus widened have the funnel shapes in the cross-sectional view, the cap layers 920 would also have the funnel shapes in the cross-sectional view with a top width greater than a bottom width.

In some embodiments, the MCESL may include, for example, but not limited to, nitride, silicon nitride, carbon-doped silicon nitride, silicon carbon nitride, other suitable materials, or combinations thereof, and may be formed using a deposition process, such as, but not limited to, CVD, PECVD, ALD, PEALD, other suitable methods, or combinations thereof. In some embodiments, each of the cap layers may have a height ranging from about 3 nanometers to about 60 nanometers, and a ratio between the height of the cap layer and the height of the SAC layer may range from about 15% to about 100%.

Figure 12:
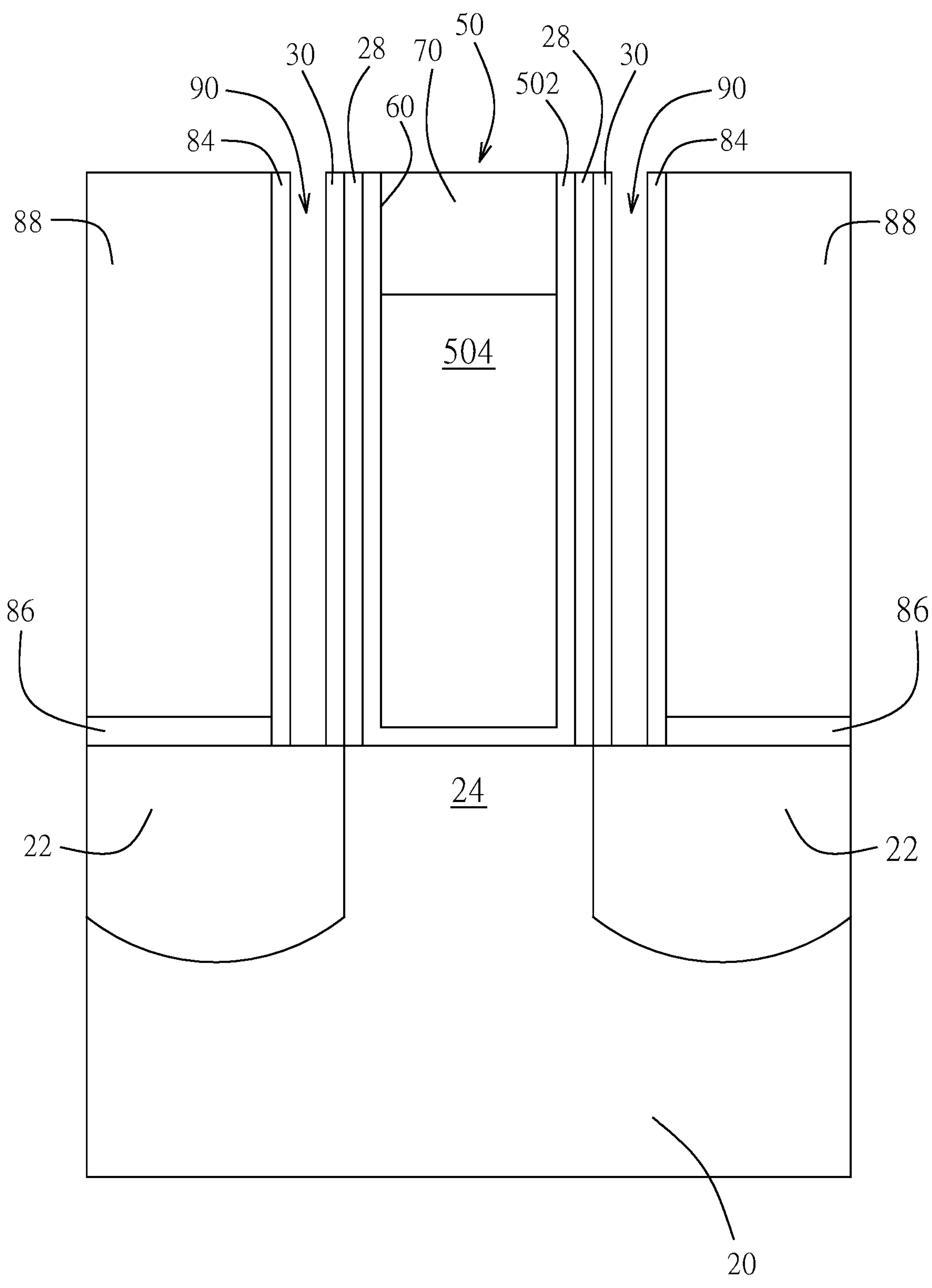
Figure 15:
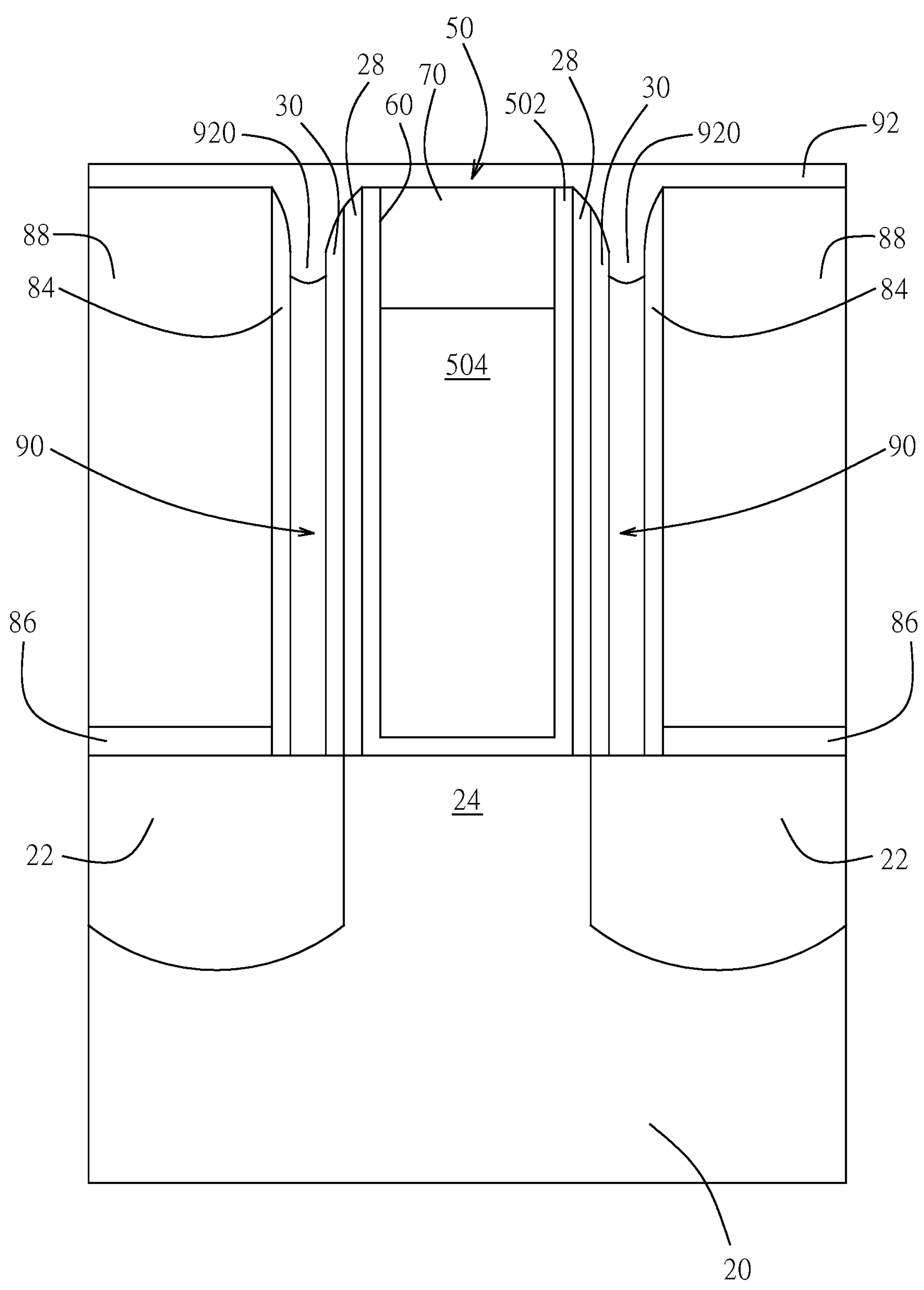
Figure 16:
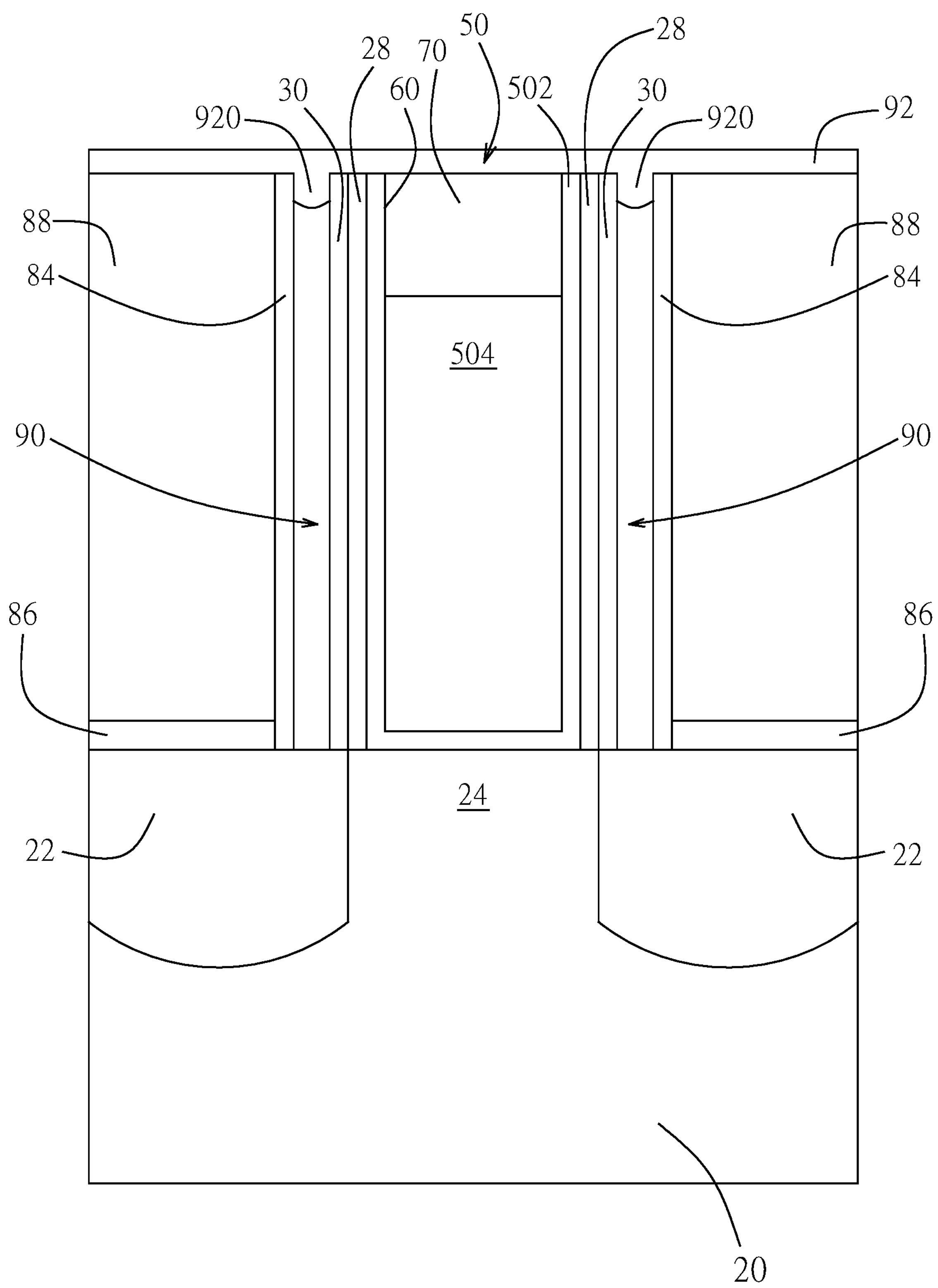
Figure 17:
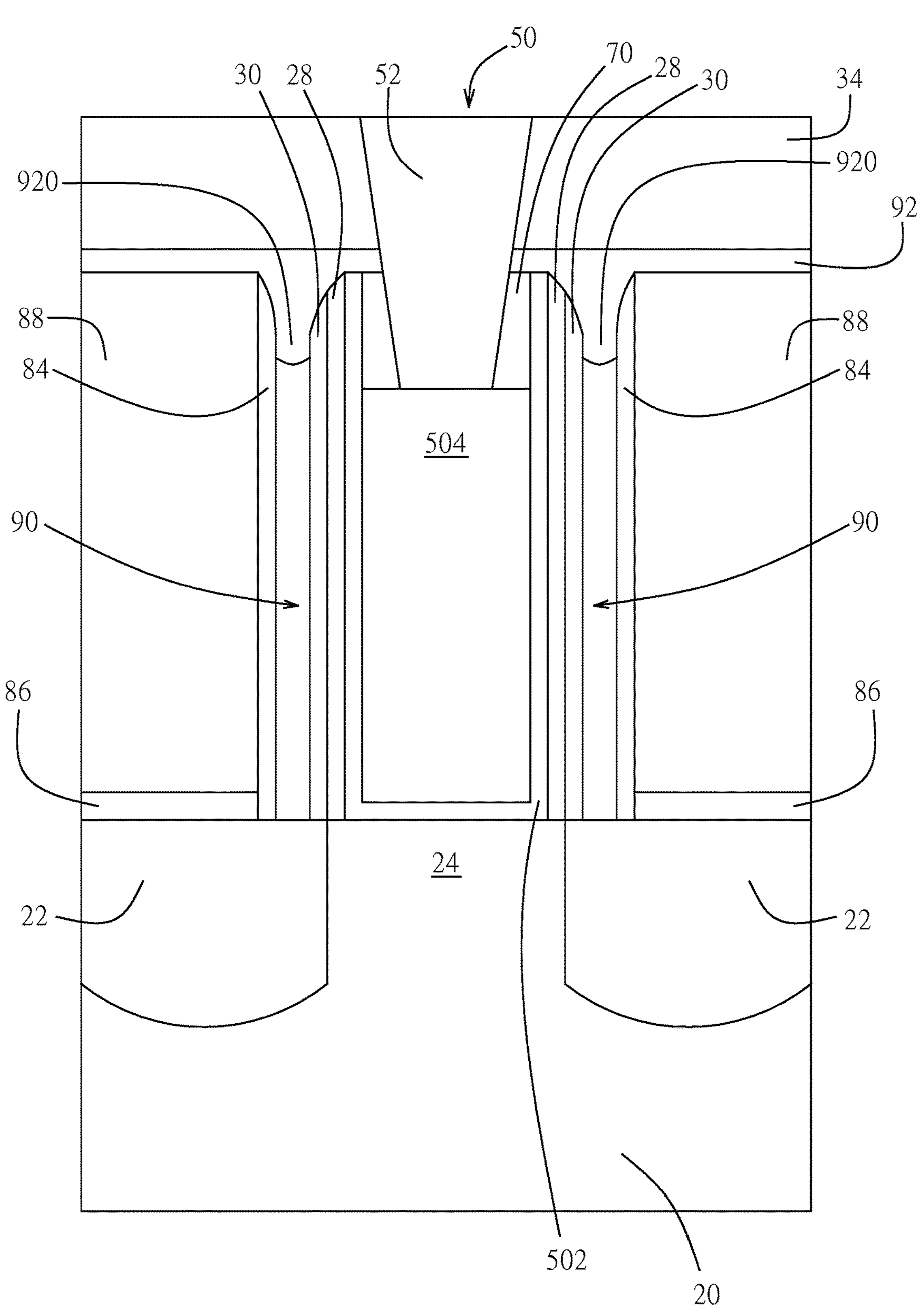
Figure 18:
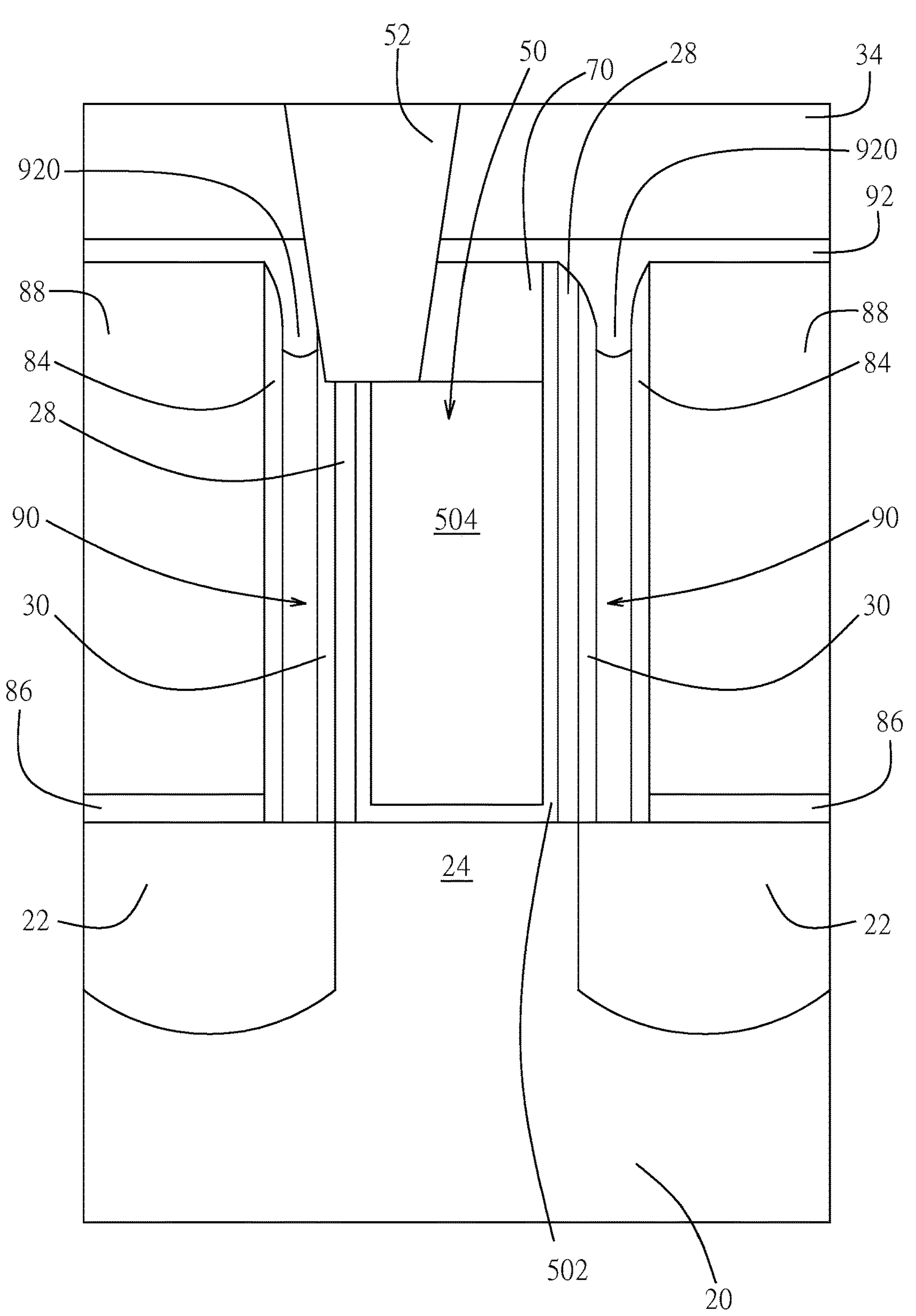

Referring to FIG. 16, which illustrates a variation of the example shown in FIG. 15, where the MCESL 92 is formed over a structure of the semiconductor device shown in FIG. 12 where the openings of the air gaps 90 are not widened. In other words, for such variation, step 112 of the method 100 is omitted, and step 113 is performed directly following step 111, that is to say, after the sacrificial layers are removed to form the air gaps 90, the MCESL: 92 is formed over the SAC layer 70 and the contact plugs 88 and partially fills the air gaps 90 so as to form the cap layers 920 for sealing the openings of the air gaps 90. In some embodiments, since the openings of the air gaps are not widened, the cap layers thus formed may be shorter and narrower compared with the funnel-shaped cap layers shown in FIG. 15, which are wider and thicker (i.e., extending deeper into the air gaps). In certain embodiments where the openings of the air gaps are not widened, each of the cap layers may have a height ranging from about 1 nanometer to about 3 nanometers, and a ratio between the height of the cap layer and the height of the SAC layer may range from about 2% to about 15%.

Referring to FIG. 1, the method 100 then proceeds to step 114, where another ILD layer is formed over the MCESL, a gate via hole is formed in the another MD layer, and a gate via (or a gate plug) is formed in the gate via hole. Referring to the example illustrated in FIG. 17, which continues from the example of FIG. 15, another ILD layer 34 is formed over the MCESL 92 that includes the funnel-shaped cap layers 920, a gate via hole (not shown) is subsequently formed in the ILD layer 34 and through the MCESL 92 and the SAC layer 70 by using suitable photolithography and etching processes, and a gate via 52 is formed in the gate via hole and is electrically connected to the gate structure 50. Formation process and material selection of the ILD layer 34 may be similar to those of the ILD layer explained in connection with step 102 above, and the details thereof are omitted for the sake of brevity. The photolithography and etching processes for forming the gate via hole may be implemented in a manner similar to those for forming the MD recesses explained in connection with step 107 above, and the details thereof are omitted for the sake of brevity. In some embodiments, the gate via may include, such as, but not limited to, copper, titanium, tantalum, tungsten, aluminum, cobalt, molybdenum, nickel, alloys, and other suitable conductive materials. The gate via may be formed by CVD, ALD, electroplating, or other suitable processes. In some embodiments, a diffusion barrier layer (not shown) is formed in the gate via hole prior to forming the gate via to protect either one of metals (i.e., the gate via and the gate electrode) from corrupting the other. The diffusion barrier layer may include a conductive oxide, nitride, or oxynitride of a metal selected from the group consisting of aluminum, manganese, cobalt, titanium, tantalum, tungsten, nickel, tin, and magnesium. In some embodiments, the diffusion barrier layer is TaN or TiN. The diffusion barrier layer may be formed by using CVD, ALD, PVD, or other suitable processes.

It is noted that since the funnel-shaped cap layers 920 are wider and thicker as exemplarily shown in FIG. 15 due to the widened openings of the air gaps 90, if the gate via hole is not accurately formed over the gate structure 50, for example, if the gate via hole deviates from a center of the gate structure 50 and is formed closer to one of the contact plugs 88 (see the example of FIG. 18), the funnel-shaped cap layers 920 may protect the liner layers 84 from breaking during the etching process carried out to form the gate via hole. In this way, the contact plugs 88 may still be covered by the liner layers 84 and the funnel-shaped cap layers 920, and after the gate via 52 is formed in the gate via hole, the gate via 52 may still be prevented from being in electrical contact with the contact plugs 88, thereby preventing leakage of electric current between the gate via 52 and the contact plugs 88. In addition, the funnel-shaped cap layers 920 may further act as insulating barriers between the gate via 52 and the respective contact plugs 88, thereby further promoting the effect of leakage prevention.

Accordingly, the dimensions of the cap layers 920 are relevant to the effect of leakage prevention. When the height of the cap layers 920 is smaller than the lower limit (e.g., about 3 nanometers) or when the ratio between the height of the cap layer and the height of the SAC layer is smaller than the lower limit (e.g., about 15%), the cap layers may not provide sufficient protection for the liner layers during the etching process carried out to form the gate via hole and may not properly act as insulating barriers between the gate via 52 and the respective contact plugs 88. On the other hand, when the height of the cap layers 920 is larger than the upper limit (e.g., about 60 nanometers) or when the ratio between the height of the cap layer and the height of the SAC layer is larger than the upper limit (e.g., about 100%), the cap layers 920 may extend deep into the air gaps 90 and be formed between the gate electrode 504 and the respective contact plugs 88, diminishing the purpose of the air gaps to reduce device capacitance in the semiconductor device.

In subsequent processes (e.g., via-to-contact formation processes), each of the epitaxy regions 22 (source/drain regions) may be electrically connected to an outer metal wiring (not shown) through a respective one of the contact plugs 88. The contact plugs 88 may be referred to as "metal-to-device (MD) contacts" for serving as contacts to oxide diffusion (OD) regions of the semiconductor device, for example, the epitaxy regions 22.

Figure 19:
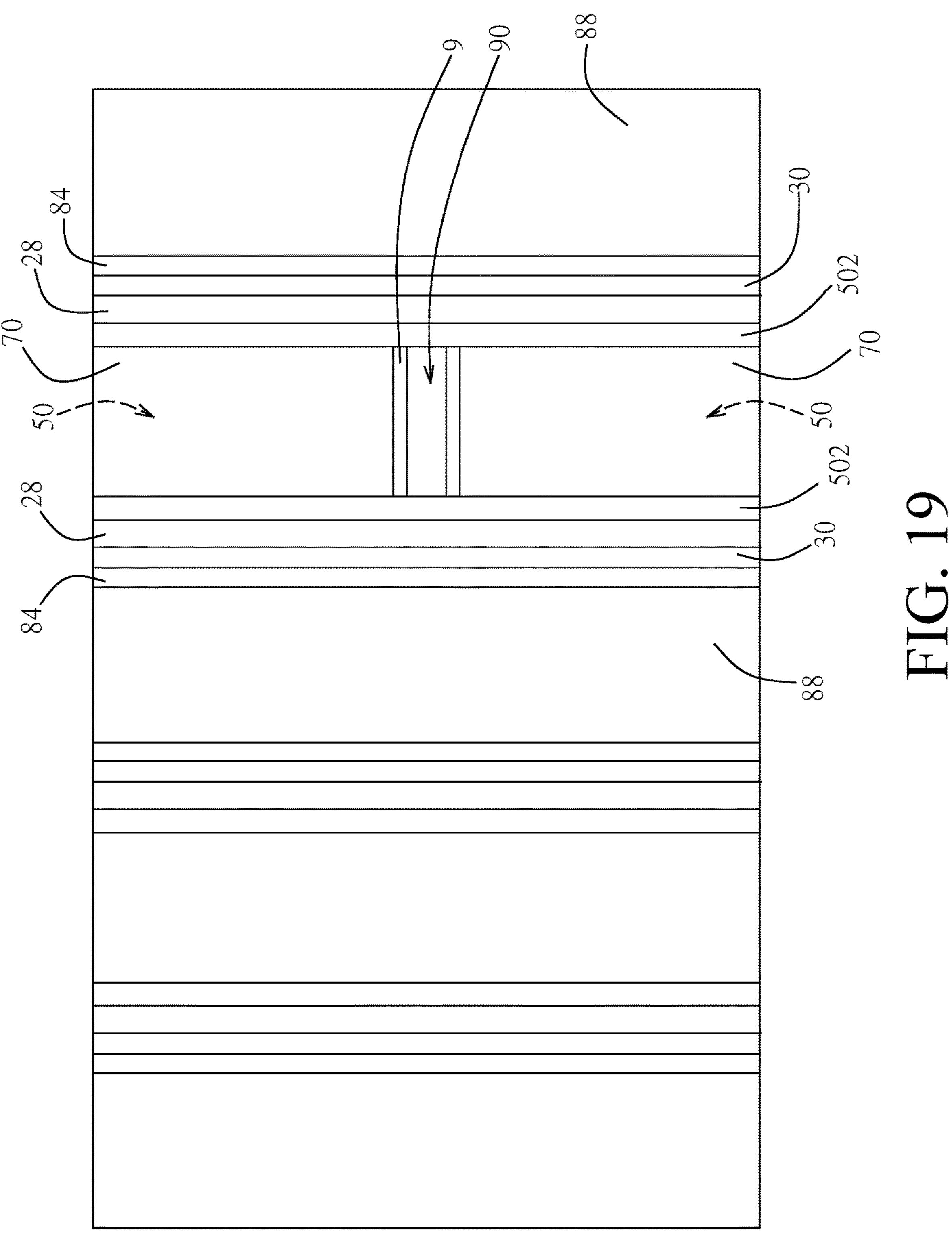
FIGS. 19 and 20 are top views illustrating alternative locations of an air gap structure in accordance with some embodiments.
Figure 20:
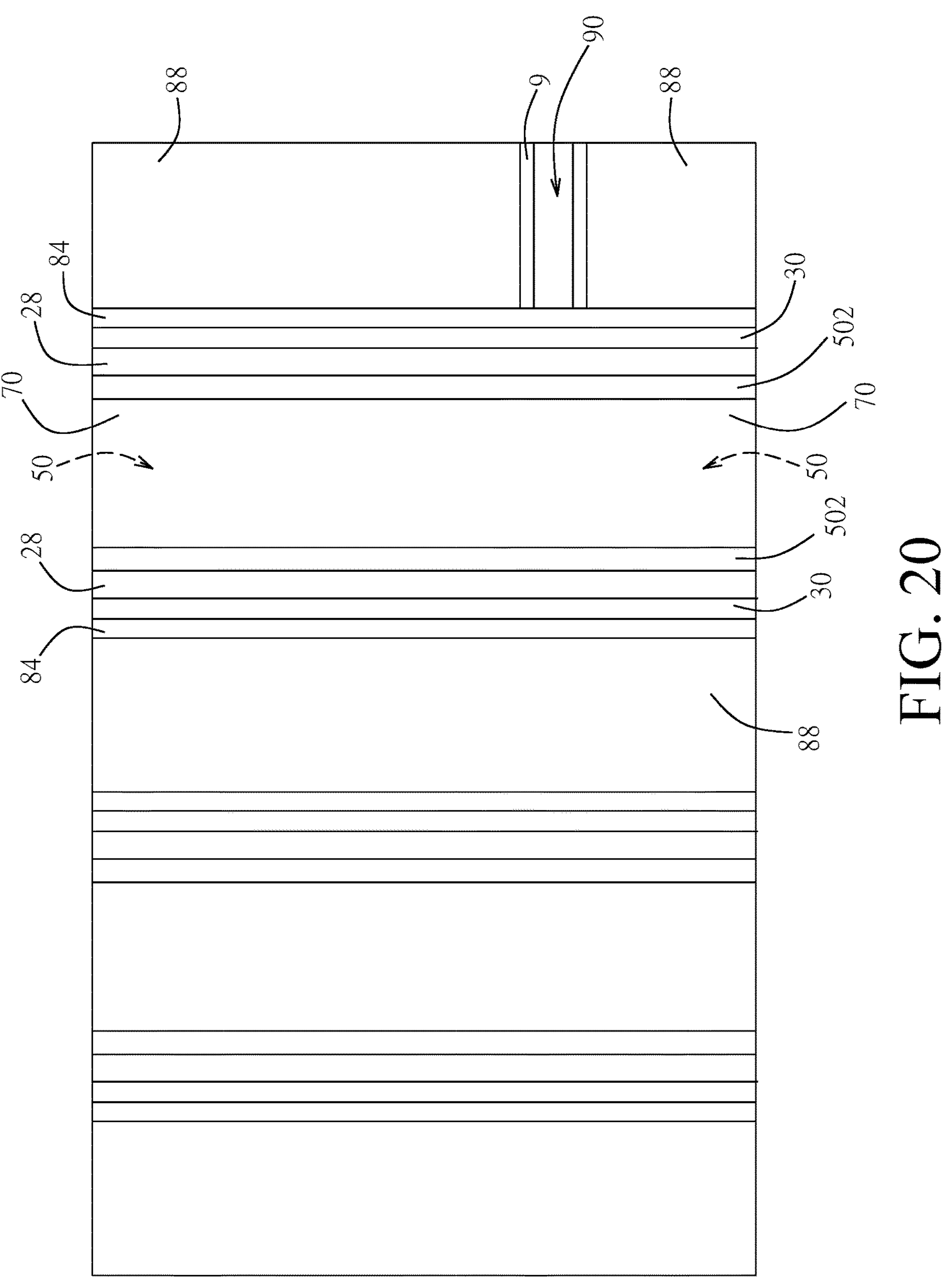

In alternative embodiments, an air gap structure having the air gaps which have opening sealed by the funnel-shaped cap layers (i.e., the openings of the air gaps having been enlarged before forming the MCESL) may not be limited to being located between the gate structure and the contact plugs as exemplarily shown in FIG. 15, and may be formed at a suitable location between two adjacent conductors where device capacitance in the semiconductor device is desired to be reduced. Referring to an example illustrated in FIG. 19, which is a top view of an exemplary semiconductor device formed after the step of widening an air gap opening of the method 100, an air gap structure 9 which may include two liners bordering an air gap 90 is located between two gate structures 50 (under SAC layers 70) that are adjacent to each other and that extend along a gate direction (i.e., top-bottom direction of FIG. 19). Referring to another example illustrated in FIG. 20, which is a top view of an exemplary semiconductor device after the step of widening an air gap opening of the method 100, an air gap structure 9 which may include two liners bordering an air gap 90 is located between two contact plugs 88 that are adjacent to each other and that extend along the gate direction (i.e., top-bottom direction of FIG. 20).

In this disclosure, an opening of an air gap may be widened by etching back upper ends of an air gap structure that has the air gap (e.g., the upper ends of the BCESL and the liner layer exemplarily shown in FIG. 13 or 14). Afterward, when forming the MCESL over the semiconductor device, the MCESL may partially fill the air gap with the opening widened so as to form air cap layer which has a funnel shape and which seals the opening of the air gap. In this way, the funnel-shaped cap layer may act as a protector and protect the air gap structure from breaking during a subsequent etching process. As a result, a conductor beside the air gap may still be covered by the air gap structure and the funnel-shaped cap layer, so the conductor is prevented from being in electrical contact with another conductor formed subsequent to the etching process, thereby preventing leakage of electric current between the two conductors. In addition, the funnel -shaped cap layer may further act as an insulating barrier between the two conductors, further promoting the effect of leakage prevention.

In accordance with some embodiments of the present disclosure, a method of forming a cap layer for sealing an air gap includes forming a line feature over a substrate, forming a first contact etch stop layer (CESL) on a sidewall of the line feature, forming a sacrificial layer on a sidewall of the first CESL, forming a liner layer on a sidewall of the sacrificial layer, removing the sacrificial layer to form an air gap which is bordered at the first CESL and the liner layer and which is adjacent to the line feature, etching back upper ends of the first CESL and the liner layer to widen an opening of the air gap; and forming a cap layer to seal the opening of the air gap thus widened. In some embodiments, the line feature may include the dummy gate stack 26 and the gate spacers 28 as show in FIG. 2. In some embodiments, the line feature may include the gate structure 50 and the gate spacers 28 as show in FIG. 7.

In accordance with some embodiments of the present disclosure, etching back upper ends of the first CESL and the liner layer includes performing anisotropic etching on the upper ends in such a manner that corners of the upper ends are rounded off.

In accordance with some embodiments of the present disclosure, the line feature includes a gate and a gate spacer formed on a sidewall of the gate. Forming a first CESL includes forming the first CESL on a sidewall of the gate spacer. The method further includes etching back an upper end of the gate spacer during etching back uppers ends of the first CESL and the liner layer to further widen the opening of the air gap.

In accordance with some embodiments of the present disclosure, forming a cap layer includes forming a second CESL over the line feature, the first CESL and the liner layer so that the second CESL partially fills the air gap to form the cap layer.

In accordance with some embodiments of the present disclosure, forming a sacrificial layer includes forming a sacrificial film over the line feature, the first CESL and the substrate, and removing portions of the sacrificial film on top surfaces of the line feature, the first CESL and the substrate so that a remaining portion of the sacrificial film on the sidewall of the first CESL forms the sacrificial layer.

In accordance with some embodiments of the present disclosure, forming a liner layer includes forming a liner film over the line feature, the first CESL, the sacrificial layer and the substrate, and removing portions of the liner film on top surfaces of the line feature, the first CESL, the sacrificial layer and the substrate so that a remaining portion of the liner film on the sidewall of the sacrificial layer forms the liner layer.

In accordance with some embodiments of the present disclosure, subsequent to forming a liner layer and prior to removing the sacrificial layer, the method further includes forming a metal contact beside the liner layer. The sacrificial layer is between the line feature and the metal contact.

In accordance with some embodiments of the present disclosure, a method of forming a cap layer for sealing an air gap includes forming epitaxy regions on a semiconductor substrate, which includes a fin between the epitaxy regions and a dummy gate stack over the fin, forming first contact etch stop layers (CESLs) on sidewalls of the dummy gate structure, replacing the dummy gate stack with a gate structure, forming sacrificial layers on sidewalls of the first CESLs, forming liner layers on sidewalls of the sacrificial layers, forming contact plugs beside the liner layers and over the epitaxy regions, removing the sacrificial layers to form air gaps, where each of the air gaps is bordered at one of the first CESLs and a corresponding one of the liner layers adjacent to said one of the first CESLs, and the contact plugs are spaced apart from the gate structure by the air gaps, respectively, widening openings of the air gaps by etching back upper ends of the first CESLs and the liner layers, and forming cap layers in upper ends of the air gaps to seal the openings of the air gaps thus widened.

In accordance with some embodiments of the present disclosure, the semiconductor substrate further includes gate spacers formed on sidewalls of the dummy gate stack. Forming first CESLs includes forming a contact etch stop layer (CESL) material over the dummy gate stack, the gate spacers and the epitaxy regions, forming an interlayer dielectric (ILD) layer over the CESL material, and planarizing the ILD layer where a portion of the CESL material is removed during the planarization to expose the dummy gate stack and to form the first CESLs on sidewalls of the gate spacers and over the epitaxy regions.

In accordance with some embodiments of the present disclosure, subsequent to replacing the dummy gate stack and prior to forming the sacrificial layers, the method further includes removing the ILD layer and the first CESLs over the epitaxy regions to form contact holes and to expose the epitaxy regions from the contact holes.

In accordance with some embodiments of the present disclosure, forming the sacrificial layers includes forming a sacrificial film over the gate structure, the gate spacers, the first CESLs and the epitaxy regions, and removing portions of the sacrificial film on top surfaces of the gate structure, the gate spacers, the first CESLs and the epitaxy regions so as to form the sacrificial layers on the sidewalls of the first CESLs.

In accordance with some embodiments of the present disclosure, forming the liner layers includes forming a liner film over the gate structure, the gate spacers, the first CESLs, the sacrificial layers and the epitaxy regions, and removing portions of the liner film on top surfaces of the gate structure, the gate spacers, the first CESLs, the sacrificial layers and the epitaxy regions so as to form the liner layers on the sidewalls of the sacrificial layers.

In accordance with some embodiments of the present disclosure, forming contact plugs includes forming silicide layers respectively on the epitaxy regions exposed from the contact holes, filling the contact holes with a conductive material, and planarizing the conductive material to form the contact plugs in the contact holes, respectively.

In accordance with some embodiments of the present disclosure, widening openings of the air gaps includes etching back upper ends of the gate spacers when etching back the upper ends of the first CESLs and the liner layers.

In accordance with some embodiments of the present disclosure, widening openings of the air gaps includes etching back the upper ends of the first CESLs and the liner layers by using an anisotropic etching process to round off corners of the upper ends.

In accordance with some embodiments of the present disclosure, forming the cap layers includes forming a second CESL over the gate structure and the contact plugs. The second CESL partially fills the air gaps to form cap layers to seal the openings of the air gaps.

In accordance with some embodiments of the present disclosure, a semiconductor device includes a semiconductor substrate, a first conductor disposed on the semiconductor substrate, an air gap structure disposed on the semiconductor substrate and adjacent to the first conductor, where the air gap structure has an air gap, a second conductor disposed adjacent to the first conductor and spaced apart from the first conductor by the air gap structure, and a cap layer disposed at an upper end of the air gap structure and sealing an opening of the air gap. The cap layer has a top portion and a bottom portion. A dimension of the top portion is greater than that of the bottom portion.

In accordance with some embodiments of the present disclosure, the semiconductor device further includes an epitaxy region disposed in a recess of the semiconductor substrate. The semiconductor substrate includes a fin beside the epitaxy region. The first conductor is a gate structure that is disposed on the fin. The second conductor is a contact plug that is disposed over the epitaxy region.

In accordance with some embodiments of the present disclosure, the air gap structure includes a contact etch stop layer (CESL) disposed on a sidewall of the gate structure and a liner layer disposed on a sidewall of the contact plug. The CESL and the liner layer bordering the air gap therebetween. Upper ends of the CESL and the liner spacer have corners rounded off to accommodate the cap layer that has the top portion thereof being larger than the bottom portion thereof.

In accordance with some embodiments of the present disclosure, the semiconductor device further includes a gate spacer disposed on a sidewall of the gate structure. The CESL is disposed on a sidewall of the gate spacer, and an upper end of the gate spacer also has a corner rounded off to accommodate the top portion of the cap layer.

The foregoing outlines features of several embodiments so that those skilled in the art may better understand the aspects of the present disclosure. Those skilled in the art should appreciate that they may readily use the present disclosure as a basis for designing or modifying other processes or structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a cap layer for sealing an air gap, the method comprising:

forming a line feature, which includes a gate and a gate spacer formed on a sidewall of the gate, over a substrate;

forming a first contact etch stop layer (CESL) on a sidewall of the line feature;

forming a sacrificial layer on a sidewall of the first CESL;

forming a liner layer on a sidewall of the sacrificial layer;

removing the sacrificial layer to form an air gap which is bordered at the first CESL and the liner layer and which is adjacent to the line feature;

in a stage where an etching process is performed, etching back upper ends of the gate spacer, the first CESL and the liner layer to widen an opening of the air gap; and forming a cap layer to seal the opening of the air gap thus widened, the substrate including source/drain regions and a fin between the source/drain regions, the line feature being formed on the fin, wherein forming the first CESL includes:

forming a CESL material over the gate, the gate spacer and epitaxy regions;

forming an interlayer dielectric (ILD) layer over the CESL material; and planarizing the ILD layer where a portion of the CESL material is removed during the planarization to expose the gate and to form the first CESL on a sidewall of the gate spacer and over the epitaxy regions, the method further comprising:

replacing the gate of the line feature with a gate structure; and subsequent to replacing the gate of the line feature and prior to forming the sacrificial layer, removing the ILD layer and the first CESL over the epitaxy regions to form contact holes and to expose the epitaxy regions from the contact holes.

2. The method of claim 1, wherein etching back upper ends of the first CESL and the liner layer includes performing anisotropic etching on the upper ends in such a manner that corners of the upper ends are rounded off.

3. The method of claim 1, wherein forming a first CESL includes forming the first CESL on a sidewall of the gate spacer.

4. The method of claim 1, wherein forming a cap layer includes forming a second CESL over the line feature, the first CESL and the liner layer so that the second CESL partially fills the air gap to form the cap layer.

5. The method of claim 1, wherein forming a sacrificial layer includes:

forming a sacrificial film over the line feature, the first CESL and the substrate; and removing portions of the sacrificial film on top surfaces of the line feature, the first CESL and the substrate so that a remaining portion of the sacrificial film on the sidewall of the first CESL forms the sacrificial layer.

6. The method of claim 1, wherein forming a liner layer includes:

forming a liner film over the line feature, the first CESL, the sacrificial layer and the substrate; and removing portions of the liner film on top surfaces of the line feature, the first CESL, the sacrificial layer and the substrate so that a remaining portion of the liner film on the sidewall of the sacrificial layer forms the liner layer.

7. The method of claim 1, subsequent to forming a liner layer and prior to removing the sacrificial layer, further comprising forming a metal contact beside the liner layer, the sacrificial layer being between the line feature and the metal contact.

8. A method of forming a cap layer for sealing an air gap, the method comprising:

forming epitaxy regions on a semiconductor substrate, the semiconductor substrate including a fin between the epitaxy regions, a dummy gate stack over the fin, and gate spacers formed on sidewalls of the dummy gate stack;

forming first contact etch stop layers (CESLs) on sidewalls of the dummy gate structure, wherein forming the first CESLs includes forming a CESL material over the dummy gate stack, the gate spacers and the epitaxy regions, forming an interlayer dielectric (ILD) layer over the CESL material, and planarizing the ILD layer where a portion of the CESL material is removed during the planarization to expose the dummy gate stack and to form the first CESLs on sidewalls of the gate spacers and over the epitaxy regions;

replacing the dummy gate stack with a gate structure;

forming sacrificial layers on sidewalls of the first CESLs;

forming liner layers on sidewalls of the sacrificial layers;

forming contact plugs beside the liner layers and over the epitaxy regions;

removing the sacrificial layers to form air gaps, each of the air gaps being bordered at one of the first CESLs and a corresponding one of the liner layers adjacent to said one of the first CESLs, the contact plugs being spaced apart from the gate structure by the air gaps, respectively;

widening openings of the air gaps by etching back upper ends of the first CESLs and the liner layers;

forming cap layers in upper ends of the air gaps to seal the openings of the air gaps thus widened; and subsequent to replacing the dummy gate stack and prior to forming the sacrificial layers, removing the ILD layer and the first CESLs over the epitaxy regions to form contact holes and to expose the epitaxy regions from the contact holes.

9. The method of claim 8, wherein forming the sacrificial layers includes:

forming a sacrificial film over the gate structure, the gate spacers, the first CESLs and the epitaxy regions; and removing portions of the sacrificial film on top surfaces of the gate structure, the gate spacers, the first CESLs and the epitaxy regions so as to form the sacrificial layers on the sidewalls of the first CESLs.

10. The method of claim 8, wherein forming the liner layers includes:

forming a liner film over the gate structure, the gate spacers, the first CESLs, the sacrificial layers and the epitaxy regions; and removing portions of the liner film on top surfaces of the gate structure, the gate spacers, the first CESLs, the sacrificial layers and the epitaxy regions so as to form the liner layers on the sidewalls of the sacrificial layers.

11. The method of claim 8, wherein forming contact plugs includes:

forming silicide layers respectively on the epitaxy regions exposed from the contact holes;

filling the contact holes with a conductive material; and planarizing the conductive material to form the contact plugs in the contact holes, respectively.

12. The method of claim 11, wherein widening openings of the air gaps includes:

etching back upper ends of the gate spacers when etching back the upper ends of the first CESLs and the liner layers.

13. The method of claim 11, wherein widening openings of the air gaps includes:

etching back the upper ends of the first CESLs and the liner layers by using an anisotropic etching process to round off corners of the upper ends.

14. The method of claim 8, wherein forming the cap layers includes forming a second CESL over the gate structure and the contact plugs, the second CESL partially filling the air gaps to form cap layers to seal the openings of the air gaps.

15. A semiconductor device comprising:

a semiconductor substrate;

a first conductor disposed on the semiconductor substrate;

an air gap structure disposed on the semiconductor substrate and adjacent to the first conductor, the air gap structure having an air gap;

a second conductor disposed adjacent to the first conductor and spaced apart from the first conductor by the air gap structure;

a cap layer disposed at an upper end of the air gap structure and sealing an opening of the air gap, the cap layer having a top portion and a bottom portion, a dimension of the top portion being greater than that of the bottom portion; and an epitaxy region disposed in a recess of the semiconductor substrate, wherein the semiconductor substrate includes a fin beside the epitaxy region, the first conductor is a gate structure that is disposed on the fin, and the second conductor is a contact plug that is disposed over the epitaxy region; and wherein the air gap structure includes a contact etch stop layer (CESL) disposed on a sidewall of the gate structure and a liner layer disposed on a sidewall of the contact plug, the CESL and the liner layer bordering the air gap therebetween, upper ends of the CESL and the liner spacer being in direct contact with the cap layer, and having corners rounded off to accommodate the cap layer;

the semiconductor device further comprising a gate spacer disposed on a sidewall of the gate structure, wherein an upper end of the gate spacer also has a corner rounded off to form a receiving surface for accommodating the top portion of the cap layer, the receiving surface being inclined toward the semiconductor substrate from one side adjacent to the gate structure to an opposite side adjacent to the air gap.

16. The semiconductor device of claim 15, wherein the CESL is disposed on a sidewall of the gate spacer.

17. The semiconductor device of claim 15, further comprising another CESL that is disposed over the gate structure and the contact plug, and that partially fills the air gap so as to form the cap layer.

18. The semiconductor device of claim 17, further comprising an interlayer dielectric (ILD) layer that is disposed on the another CESL, and a gate via that extends through the ILD layer and the another CESL and that is electrically connected to the gate structure.

19. The semiconductor device of claim 17, further comprising a self-aligned contact (SAC) layer disposed between the gate structure and the another CESL, wherein a ratio between a height of the cap layer and a height of the SAC layer ranges from 15% to 100%.

20. The semiconductor device of claim 15, wherein the cap layer has a height ranging from 3 nanometers to 60 nanometers.

* * * * *